(12) United States Patent
Kurikawa

(10) Patent No.: US 7,463,338 B2
(45) Date of Patent: Dec. 9, 2008

(54) CONTAINER FOR HOUSING A MASK BLANK, METHOD OF HOUSING A MASK BLANK, AND MASK BLANK PACKAGE

(75) Inventor: Akinori Kurikawa, Tokyo (JP)

(73) Assignee: Hoya Corporation, Tokyo (JP)

( * ) Notice: Subject to any disclaimer, the term of this patent is extended or adjusted under 35 U.S.C. 154(b) by 388 days.

(21) Appl. No.: 10/886,039

(22) Filed: Jul. 8, 2004

(65) Prior Publication Data

US 2005/0006266 A1    Jan. 13, 2005

(30) Foreign Application Priority Data

| Jul. 8, 2003 | (JP) | ............................. 2003-271924 |
| Jul. 25, 2003 | (JP) | ............................. 2003-279961 |
| Aug. 12, 2003 | (JP) | ............................. 2003-292317 |
| Aug. 25, 2003 | (JP) | ............................. 2003-299711 |

(51) Int. Cl.
   *G03B 27/62*    (2006.01)
(52) U.S. Cl. ............................. 355/75; 355/72; 206/455
(58) Field of Classification Search .................. 355/75, 355/72; 206/449, 455
   See application file for complete search history.

(56) References Cited

U.S. PATENT DOCUMENTS

| 5,740,845 | A  * | 4/1998 | Bonora et al. ............... 141/292 |
| 6,443,302 | B2 * | 9/2002 | Tanaka .................... 206/316.1 |
| 6,543,617 | B2 * | 4/2003 | Angelopoulos et al. ..... 206/701 |
| 6,732,877 | B2 * | 5/2004 | Wu et al. .................... 220/330 |
| 7,029,013 | B2 * | 4/2006 | Yajima et al. ............... 277/637 |
| 2005/0155874 | A1* | 7/2005 | Chen ......................... 206/204 |

FOREIGN PATENT DOCUMENTS

| JP | 6-20906 A | 1/1994 |
| JP | 8-148551 A | 6/1996 |
| JP | 8-172038 A | 7/1996 |
| JP | 11-238788 A | 6/1999 |
| JP | 2000-66380 A | 3/2000 |
| JP | 2001-154341 A | 6/2001 |
| JP | 2001-301877 A | 10/2001 |
| JP | 2002-46793 A | 2/2002 |
| JP | 2003-75991 A | 3/2003 |
| JP | 2003-118776 A | 4/2003 |
| JP | 2003-140324 A | 5/2003 |
| JP | 2003-140325 A | 5/2003 |
| KR | 1998-070740 A | 10/1998 |
| KR | 1998-068005 | 12/1998 |
| KR | 1999-0083126 A | 11/1999 |

OTHER PUBLICATIONS

Japanese Office Action for 2003-271924, dated Sep. 2, 2008.
Japanese Office Action for 2003-299711, dated Sep. 2, 2008.
Japanese Office Action for 2003-292317, dated Sep. 2, 2008.
Japanese Office Action for 2003-279961, dated Sep. 2, 2008.

* cited by examiner

*Primary Examiner*—Della J. Rutledge
(74) *Attorney, Agent, or Firm*—Sughrue Mion, PLLC

(57) ABSTRACT

A container is adapted to receive a mask blank having a resist film and includes a container body having an upper opening and a cap put on the container body. The container body has an opening edge provided with an annular elastic member made of polyolefin elastomer or the like and extending throughout entire circumference. When the cap is put on the container body, the elastic member is interposed at a joint portion between the cap and the container body to hermetically seal the container.

22 Claims, 6 Drawing Sheets

US 7,463,338 B2

CONTAINER FOR HOUSING A MASK BLANK, METHOD OF HOUSING A MASK BLANK, AND MASK BLANK PACKAGE

This application claims priority to prior Japanese applications JP 2003-271924, 2003-279961, 2003-292317, and 2003-299711, the disclosures of which are incorporated herein by reference.

BACKGROUND OF THE INVENTION

This invention relates to a container for housing a photo mask for use in fabrication of an electronic device or a mask blank for use in fabrication of the photo mask and to a method of housing the photo mask or the mask blank.

This invention also relates to a method of housing a mask blank with a resist film, which is for producing a photo mask for use in manufacture of an electronic device.

This invention also relates to a method of treating a housing member for housing a mask blank with a resist film, which is for producing a photo mask for use in manufacture of an electronic device.

Following rapid development of the IT (Information Technology) industry, a recent electronic device, in particular, a semiconductor device, a color filter or a TFT (Thin Film Transistor) element for a LCD (Liquid Crystal Display) monitor, or the like is required to have a finer structure. One of techniques supporting fine process technology for such a finer structure is a lithography technique using a photo mask called a transfer mask. In the lithography technique, a silicon wafer with a resist film is exposed through the transfer mask to an electromagnetic wave from an exposure light source so that a fine pattern is formed on the silicon wafer. Generally, the transfer mask is produced by preparing a mask blank comprising a light transparent substrate and a light shielding film formed thereon and forming an original pattern on the mask blank by the use of the lithography technique. If foreign matters such as particles are present on a surface of the mask blank, this may result in occurrence of a defect of the pattern formed on the silicon wafer. Therefore, the mask blank must be stored in a clean condition so that no foreign matters are adhered or attached to the surface of the mask blank.

For example, as a conventional container for housing, storing, and carrying a mask blank, a mask carrying case is disclosed in Japanese Patent Application Publication (JP-A) No. 2001-154341.

Specifically, the conventional container for housing and storing a mask blank comprises an inner case called a carrier, an outer case (container body), and a cap. Several to several tens of mask blanks are held in the inner case in parallel to one another. The inner case with the mask blanks held therein is received in the outer case. Then, the cap is put on the outer case. In this manner, the mask blanks are housed in the container. An adhesive tape is attached to a joint portion between the outer case and the cap to hermetically seal the container and to prevent entry of ambient air and foreign matters. In most cases, the container is made of a resin material.

Following recent improvement in performance of the electronic device, the original pattern formed on the transfer mask is also required to be finer. In order to form such a finer pattern, the mask blank must have an extremely high cleanliness. Therefore, it is necessary to maintain as high cleanliness as possible, in particular, during storage of the mask blank by minimizing adhesion of foreign matters to the mask blank. Among others, in case of a mask blank having a resist film formed on a surface thereof, the foreign matters once adhered to the surface are difficult to be removed. Further, cleaning is impossible at this stage. Therefore, patterning is carried out with the foreign matters adhered to the surface. This results in occurrence of a pattern defect.

In the meanwhile, attention is recently directed to a chemically amplified resist as a resist for a photo mask. For example, the chemically amplified resist is described in Japanese Patent Application Publication (JP-A) No. 2000-66380. The chemically amplified resist is superior in characteristics, such as sensitivity and contrast, than a photo resist which has been used so far and is therefore advantageous in forming a finer pattern. However, it is pointed out that the chemically amplified resist is susceptible to an influence of a contaminant of a chemical component because of its reaction mechanism. Specifically, in presence of a contaminant of a certain chemical component, a function of a substance serving as a catalyst for chemical amplification may be suppressed or inhibited (for example, deactivated) so that a desired performance can not be obtained.

The chemically amplified resist contains either a high-molecular-weight compound having a resist function (positive type) or a low-molecular-weight compound which produces a high-molecular-weight compound by a cross-linking reaction or the like (negative type), and a catalytic substance. By irradiating the chemically amplified resist with energy radiation such as electron wave or electromagnetic wave, the catalytic substance contained therein is exposed to produce an acidic catalytic substance in the resist. The acidic catalytic substance has a catalytic function for a chemical reaction (chemical amplification) of making the high-molecular-weight compound soluble to a liquid developer or producing a high-molecular-weight compound and making the high-molecular-weight compound insoluble to the liquid developer. However, it is pointed out that the chemically amplified resist is susceptible to an influence of a contaminant of a basic chemical substance because of its reaction mechanism. Specifically, in presence of a contaminant of a certain basic chemical substance, for example, ammonia or amine, production of the acidic catalytic substance serving as a catalyst for chemical amplification may be inhibited or a function of the acidic catalytic substance produced as mentioned above may be suppressed or inhibited (for example, deactivated) so that a desired performance can not be obtained.

In view of the above, in case of the mask blank with a chemically amplified resist film formed thereon, it is necessary not only to eliminate foreign matters such as particles but also to eliminate an influence of a contaminant of a chemical substance. Therefore, the mask blank with a chemically amplified resist film must be stored in an especially clean atmosphere.

In the conventional container for a mask blank, the joint portion between the outer case and the cap is hermetically sealed by the adhesive tape. However, this requires double efforts of adhering the tape upon housing and packaging the mask blank and removing the tape upon opening the container. In addition, a sealed state is incomplete or insufficient. Specifically, the adhesive tape generally used has some breathability. Depending upon temperature variation of the atmosphere in which the container is stored, internal air within the container may be expanded or contracted. In this event, airflow between the ambient air and the internal air occurs through the joint portion to which the tape is adhered. Sometimes, pressure of the atmosphere may be varied, for example, in case where the mask blank is transported on board an aircraft. In case of transportation on board the airplane, variation in pressure is considerably large. In this case also, airflow occurs between the ambient air and the internal air. Therefore, even if the mask blank is housed and packaged into the container in a clean atmosphere such as a clean room, the ambient air may enter into the container with lapse of time depending upon a storage atmosphere after packaging. In this event, the interior of the container may be contaminated by a certain component contained in the ambient air.

Further, even if the container is made of a material, such as plastic, which hardly releases any chemical component or the like, a chemical component used in a base member of the adhesive tape or an adhesive agent may enter into the container with lapse of time to cause contamination. In particular, upon occurrence of variation in atmosphere, such as temperature change or pressure change mentioned above, contamination by the chemical component released from the tape may be accelerated.

In particular, in case of the mask blank with the chemically amplified resist film mentioned above, contamination by the chemical component or the like causes a crucial defect and must be completely avoided.

At a glance, it seems possible, by housing and packaging the mask blank into the container within the clean room or the like and sealing the joint portion between the outer case and the cap by the adhesive tape, to prevent entry of the ambient air and store the mask blank in a clean atmosphere. Actually, however, it is difficult to avoid contamination by the entry of the ambient air or contamination by the chemical component of the adhesive tape.

According to the study by the present inventor, it has been found out that, even if contamination by the basic chemical substance is avoided, a stable resist function is not always obtained and a desired resist pattern is not always formed. Specifically, it has been found out that, even if a factor causing the basic substance such as amine to be generated during a manufacturing process of the mask blank having the chemically amplified resist film is thoroughly investigated and eliminated and, further, close attention is paid to an environment of housing and packaging the mask blank, there still arises a problem of fluctuation in accuracy of the resist pattern formed on the mask blank.

In order to eliminate the influence of the contaminant of the basic chemical substance, the mask blank with the chemically amplified resist film may be housed and packaged in an atmosphere cleaned by the use of a chemical filter. Even in this event, the mask blank housed in the container may be contaminated by a basic substance released as an outgas from the container during subsequent storage. In particular, depending upon the temperature change or the pressure change of the ambient air during storage, release of an outgas component may be accelerated. In this case, it is proposed to use a material which releases a small amount of the outgas component with lapse of time. In this approach, however, contamination with lapse of time can not completely be eliminated and the material of the container is restricted.

SUMMARY OF THE INVENTION

In order to remove the above-mentioned disadvantages, it is an object of this invention to provide a container and a housing method which are capable of storing a mask blank or the like while keeping a clean atmosphere upon housing by inhibiting entry of ambient air to avoid contamination by a chemical substance or the like.

It is another object of this invention to provide a container and a housing method which are suitable for a mask blank provided with a chemically amplified resist film and required to be stored in an especially clean atmosphere.

It is still another object of this invention to provide a method of housing a mask blank, which is suitable for a mask blank provided with a chemically amplified resist film and required to be stored in an especially clean atmosphere and which is capable of maintaining a stable resist function for forming a desired mask pattern.

It is yet another object of this invention to provide a method of treating a housing member for housing a mask blank, which is suitable for a mask blank provided with a chemically amplified resist film and required to be stored in an especially clean atmosphere and which is capable of maintaining a stable resist function for forming a desired mask pattern.

Generally, it is supposed that, by housing a mask blank into a container in a clean atmosphere, such as a clean room, and adhering an adhesive tape to a joint portion of the container to seal the container, the mask blank can be stored while keeping the clean atmosphere. However, as revealed by the study of the present inventor, it is difficult in the known method to keep the clean atmosphere in the container with the mask blank housed therein after lapse of time. It is also found out that, particularly in case of the mask blank having a chemically amplified resist film, a desired fine pattern may not be formed during fabrication of a mask and a stable resist function may not be obtained if the mask blank is stored by the known housing method.

The present inventor earnestly and diligently studied in order to remove the above-mentioned problem. As a result, it has been found out that the entry of ambient air can be prevented and a mask blank can be stored while keeping a clean atmosphere in the interior of a container by providing an elastic member formed on at least one of an opening edge of a main body of the container or a lower edge of a cap member to extend throughout entire circumference and interposed between the main body and the cap member at a joint portion thereof. Thus, this invention has been completed.

Further, as a result of earnest and diligent study of the present inventor in order to remove the above-mentioned problem, it has been found out that, even if the ambient air enters into the container during storage, the mask blank can be stored while keeping a clean atmosphere in the interior of the container, by removing foreign matters such as a chemical substance contained in the ambient air so that the foreign matters do not enter into the container even if the ambient air enters. Thus, this invention has been completed.

As described above, a contaminant for a chemically amplified resist is generally believed to be a basic chemical substance such as amine. According to the study by the present inventor, however, it has been revealed that, even if the mask blank is stored in an environment from which the basic chemical substance is eliminated, a stable resist function may not be obtained and a desired fine pattern may not be formed during manufacture of a mask.

As a result of earnest and diligent study by the present inventor in order to remove the above-mentioned problem, it has been unexpectedly found out that the mask blank having a chemically amplified resist film may be contaminated not only by the basic substance but also by adhesion of an acidic substance and formation of a stable fine pattern is inhibited. It is also found out that the acidic substance mainly affects the sensitivity of the chemically amplified resist and has a function of excessively enhancing a chemically amplifying effect. Based on a series of findings described above, this invention has been completed.

The present inventor also found out that preliminary treatment such as heating of the container is effective in order to suppress the container releasing a chemical substance inhibiting the chemically amplifying effect of the chemically amplified resist.

Based on the findings mentioned above, this invention has been completed.

Specifically, this invention has following structures.

Structure 1

A container which is for housing a mask blank in its interior and which comprises a container body having an upper opening and a cap member to be put on the container body, wherein the container has an elastic member formed on at least one of an opening edge of the container body and a lower edge of the cap member to extend throughout entire circumference so that the container is hermetically sealed when the cap member is put on the container body.

Structure 2

A container which is for housing a mask blank in its interior and which comprises a container body having an upper opening and a cap member to be put on the container body, wherein the container has an elastic member formed on at least one of an opening edge of the container body and a lower edge of the cap member to extend throughout entire circumference so that the elastic member is interposed between the opening edge of the container body and the lower edge of the cap member at a joint portion therebetween when the cap member is put on the container body.

Structure 3

A container according to structure 1 or 2, wherein the joint portion is fixed and secured by a sliding locking member for clamping the joint portion between the container body and the cap member.

Structure 4

A method of housing a mask blank, wherein a mask blank having a resist film is housed in a container according to structure 1 or 2.

Structure 5

A method according to structure 4, wherein the resist film is a chemically amplified resist film.

Structure 6

A mask blank package, which is obtained by housing a mask blank by a method according to structure 4.

According to this invention, in a container which is for housing a mask blank or the like and which comprises a container body having an upper opening and a cap member to be put on the container body, an elastic member is formed on at least one of an opening edge of the container body and a lower edge of the cap member to extend throughout entire circumference. With this structure, the container is hermetically sealed when the cap member is put on the container body. Therefore, it is possible to prevent ambient air from entering the interior of the container during storage and, consequently, to effectively prevent foreign matters in the ambient air, such as particles or any chemical substance contained in the ambient air, from entering the interior of the container to contaminate the mask blank. In other words, it is possible to store the mask blank for a long period of time while keeping a clean atmosphere in the interior of the container. In addition, it is possible to prevent contamination by a chemical component in case where an adhesive tape is used.

According to this invention, the elastic member is interposed between the opening edge of the container body and the lower edge of the cap member at the joint portion therebetween when the cap member is put on the container body. With this structure, the container is hermetically sealed merely by putting the cap member on the container. Therefore, the mask blank is easily housed without requiring an additional work.

This invention is particularly suitable for housing and storing a mask blank having a resist film which is required to be housed and stored in an especially clean atmosphere, in particular, a mask blank having a chemically amplified resist film required to be absolutely prevented from contamination by a chemical substance or the like.

This invention further has the following structures.

Structure 7

A container which is for housing a mask blank in its interior and which at least comprises a container body having an upper opening and a cap member to be put on the container body, comprises a mechanism for inhibiting entry of foreign matters in ambient air into the container.

Structure 8

A container according to structure 7, wherein the mechanism for inhibiting entry of foreign matters in ambient air into the container has a vent hole formed on the container to allow communication between the ambient air and internal air, and a filtering member formed in the vent hole to remove the foreign matters in the ambient air.

Structure 9

A method of housing a mask blank, in which a mask blank having a resist film is housed in a container according to structure 7.

Structure 10

A method according to structure 9, wherein the resist film is a chemically amplified resist.

Structure 11

A method according to structure 10, wherein the foreign matters in the ambient air is a chemical substance inhibiting a desired chemically amplifying effect in the chemically amplified resist.

Structure 12

A mask blank package, which is obtained by housing a mask blank by a method according to structure 9.

Structure 13

A method of transporting a mask blank package according to structure 12, wherein the mask blank package is transported by the use of traffic means.

According to this invention, in a container which is for housing a mask blank and which comprises a container body having an upper opening and a cap member to be put on the container body, means for inhibiting entry of foreign matters in ambient air into the container is provided. With this structure, it is possible to prevent the ambient air from directly entering the interior of the container and, consequently, to effectively prevent the foreign matters in the ambient air, such as particles or any chemical substance contained in the ambient air, from entering the interior of the container to contaminate the mask blank. Thus, even if the ambient air enters the interior of the container during storage, it is possible by cleaning the ambient air to store the mask blank for a long period of time while keeping a clean atmosphere in the interior of the container. Therefore, it is possible to prevent the mask blank from being contaminated by the foreign matters such as the chemical substance during storage and, consequently, to obtain a high-quality transfer mask by the use of the mask blank housed and stored in the above-mentioned manner.

The means for inhibiting entry of foreign matters in ambient air into the container may include a vent hole formed on the container to allow communication between the ambient air and the internal air and a filtering member formed in the vent hole to remove the foreign matters in the ambient air. With this structure, even if the ambient air enters, the foreign matters such as the chemical substance contained in the ambient air are removed by the filtering member so that the ambient air is cleaned. Therefore, it is possible to prevent contamination due to entry of the foreign matters or the chemical substance and to keep a clean atmosphere in the interior of the container.

This invention is particularly suitable for housing and storing a mask blank having a resist film which is required to be housed and stored in a clean atmosphere, in particular, a mask blank having a chemically amplified resist film required to be absolutely prevented from contamination by a chemical substance or the like.

According to this invention, when a mask blank package obtained by housing a mask blank in a container is transported to a remote place by the use of traffic means, the mask blank is not contaminated even upon occurrence of temperature change or pressure change of the ambient air. Therefore, it is possible to assure high reliability in transportation of the mask blank to a remote place.

This invention further has following structures.

Structure 14

A method of housing a mask blank having a chemically amplified resist film in a container, wherein the mask blank is housed in the container together with an atmosphere from which at least an acidic substance is removed.

Structure 15

A method of housing a mask blank having a chemically amplified resist film in a container, wherein the mask blank is housed in the container under an atmosphere from which at least an acidic substance is removed.

Structure 16

A method according to structure 14 or 15, wherein the container has means for absorbing or adsorbing the acidic substance.

Structure 17

A mask blank package, wherein a mask blank having a chemically amplified resist film is housed in a container having an atmosphere which does not contain at least an acidic substance.

Structure 18

A method of producing a mask blank with a resist film, wherein a thin film for forming a mask pattern is deposited on a substrate and a chemically amplified resist film is thereafter formed on the thin film under an atmosphere from which at least an acidic substance is removed.

Structure 19

A method of producing a mask blank with a resist film, comprising a resist forming step of forming a chemically amplified resist film on a mask blank obtained by depositing on a substrate a thin film for forming a mask pattern, a posttreating step as an optional step for treating the mask blank with the resist film, an inspection step as an optional step for inspecting the mask blank with the resist film, and a housing/packaging step of housing and packaging the mask blank with the resist film in a container, wherein at least one of the above-mentioned steps is carried out under an atmosphere from which at least an acidic substance is removed.

In this invention, the acidic substance to be removed may be, particularly, an acidic substance as an acidic contaminant adhered to the chemically amplified resist film to affect a chemically amplifying function of the chemically amplified resist. For example, the acidic substance may be a substance containing chlorine ions, a substance containing sulfate ions, a substance containing phosphate ions, or a substance containing nitrate ions. Such acidic substance mainly affects the sensitivity of the chemically amplified resist and has a function of excessively enhancing the chemically amplifying effect so that a stable resist function may not be obtained. As a result, formation of a stable resist pattern may be inhibited so that a desired fine pattern is not formed during manufacture of a mask.

The degree of removal of the acidic substance need not be 100%. It is sufficient to remove the acidic substance to the extent that the chemically amplified resist film is not contaminated even if the acidic substance is present in the atmosphere. As will readily be understood, the degree of removal of the acidic substance is preferably as high as possible in view of the quality because the cleanliness is improved. However, pursuit of a higher degree of removal may increase a production cost. Therefore, the acidic substance may be removed from the atmosphere within a profitable range and to the extent that no product defect is caused. By way of example, specific numerical values are given below. In case of the substance containing chlorine ions, the content of chlorine ions is preferably 0.05 µg or less per 1 $m^3$ of the atmosphere. In case of the substance containing sulfate ions, the content of sulfate ions is preferably 0.1 µg or less. In case of the substance containing nitrate ions, the content of nitrate ions is preferably 0.7 µg or less.

As a method of removing the acidic substance from the atmosphere, use may be made of a filter (chemical filter) for adsorbing a chemical substance. As the chemical filter for removing the acidic substance, use is preferably made of a chemical filter with an acid-neutralizing substance mixed therewith. As the acid-neutralizing substance, carbonate is preferable. As the carbonate, potassium carbonate is preferable. Preferably, an activated carbon filter containing an adsorber such as activated carbon is used as the above-mentioned chemical filter. Preferably, a filter comprising the adsorber, such as activated carbon, mixed with the acid-neutralizing substance is used as the above-mentioned chemical filter.

In this invention, as described in structure 14, a mask blank having a chemically amplified resist film is housed in a container together with an atmosphere from which at least an acidic substance is removed. Specifically, upon housing the mask blank into the container, the atmosphere from which at least the acidic substance is removed is supplied so that the mask blank is housed and stored together with the atmosphere. It is therefore possible to most preferably prevent the acidic contaminant from being adhered to the mask blank in practical application.

In order to supply the atmosphere from which the acidic substance is removed, use may be made of a method of supplying an environment of a mask blank housing operation with an atmosphere from which the acidic substance is removed by the use of the above-mentioned chemical filter, a method of supplying the container with the above-mentioned atmosphere to replace the interior of the container, and a method of purging the container by the above-mentioned atmosphere.

For example, as described in structure 15, a mask blank having a chemically amplified resist film is preferably housed in a container in an atmosphere from which at least an acidic substance is removed. Generally, the operation of housing the mask blank is carried out in a clean room. Therefore, it is easy to supply the environment of the operation of housing the mask blank with the atmosphere from which the acidic substance is removed by the use of a chemical filter.

Preferably, a basic chemical substance, such as ammonia and amine, which inhibits a desired chemically amplifying effect of the chemically amplified resist is removed together with the acidic substance. In order to remove the basic chemical substance, use may be made of a method of using a chemical filter mixed with an alkali-neutralizing substance, such as phosphoric acid. Preferably, an activated carbon filter containing an adsorber such as activated carbon is used as the above-mentioned chemical filter. Preferably, a filter comprising the adsorber, such as activated carbon, mixed with the alkali-neutralizing substance is used as the above-mentioned chemical filter.

It is preferable to use an air filter in combination with the chemical filter for removing the acidic substance or the basic substance. Preferably, such an air filter may be a HEPA filter (high efficiency particulate air filter) or an ULPA filter (ultra low penetration particulate air filter). The HEPA filter is a high-efficiency air filter and is generally made of a glass fiber material. The ULPA filter is an ultra-high performance filter and is generally made of a glass fiber or a fluorine-based resin material. As an ability of the air filter, it is preferable to trap particles having a diameter of 0.05 µm or more. The air filter such as the HEPA filter or the ULPA filter may be appropriately selected taking into account cost effectiveness and the like.

This invention further has following structures.

Structure 20

A method of treating a housing member for housing a mask blank having a chemically amplified resist film, wherein the method includes a treatment for removing from the housing member a chemical substance inhibiting a chemically amplifying effect of the chemically amplified resist film.

Structure 21

A method according to structure 20, wherein the treatment for removing the chemical substance inhibiting the chemically amplifying effect of the chemically amplified resist film is a treatment of heating the housing member.

Structure 22

A method according to structure 20, wherein a treatment of bringing the housing member into contact with heated pure water is carried out prior to the treatment for removing the chemical substance.

Structure 23

A method according to structure 20, wherein the treatment for removing the chemical substance is carried out upon a material to be formed into the housing member and/or the housing member after forming.

Structure 24

A method of producing a housing member for housing a mask blank, the method including a method of treating a housing member according to structure 20.

Structure 25

A mask blank package which is obtained by housing a mask blank with a chemically amplified resist film in a member subjected to a treatment for removing a chemical substance inhibiting a chemically amplifying effect of the chemically amplified resist film.

In this invention, the chemical substance to be removed from the housing member for housing a mask blank is a chemical substance adhered to the chemically amplified resist film and inhibiting the chemically amplifying effect of the chemically amplified resist. Presence of such chemical substance may suppress the desired chemically amplifying effect or may excessively enhance the chemically amplifying effect so that a stable resist function is not obtained. As a result, formation of a desired stable resist pattern is inhibited. Particularly, the chemical substance affecting the chemically amplifying effect of the chemically amplified resist may be an acidic substance as an acidic contaminant. The acidic substance may be a substance containing chlorine ions, a substance containing sulfate ions, a substance containing phosphate ions, or a substance containing nitrate ions. Such acidic substance mainly affects the sensitivity of the chemically amplified resist and has a function of excessively enhancing the chemically amplifying effect so that a stable resist function may not be obtained. As a result, formation of a stable resist pattern may be inhibited so that a desired fine pattern is not formed during manufacture of a mask.

Further, it is preferable to treat the housing member so that a basic substance, such as ammonia and amine, which inhibits a desired chemically amplifying effect of the chemically amplified resist is removed also.

In this invention, as the treatment for removing the chemical substance inhibiting the chemically amplifying effect of the chemically amplified resist, use may be made of heat treatment or pressure-reducing treatment. Among others, the heat treatment is preferable. By heat-treating the housing member, it is possible to preliminarily release the chemical substance contained in the housing member and possibly released as an outgas with lapse of time. Therefore, if the mask blank is housed and packaged by the use of the housing member subjected to the treatment according to this invention, such as the heat treatment, to preliminarily release the chemical substance contained in the housing member, the outgas of the chemical substance is not released with lapse of time. Thus, it is possible to prevent the mask blank having a chemically amplified resist film from being contaminated by the chemical substance and to maintain a stable resist function for forming a desired mask pattern.

Upon carrying out the heat treatment, it is appropriate to heat the housing member so that the atmosphere at least exceeds room temperature. Generally, the mask blank is housed and stored in a temperature region around the room temperature. Therefore, by the above-mentioned heat treatment, it is possible to prevent the outgas of the chemical substance from being released in the temperature region in which the mask blank is housed and stored by the use of the housing member subjected to the treatment according to this invention. The heating temperature and the heating time may appropriately be selected depending upon the characteristic of the chemically amplified resist and taking into account the degree of influence of the chemical substance upon the chemically amplifying effect, which causes product defects. The heating temperature must fall within a range such that the effect of this invention is achieved and is practically between 40 and 90° C., particularly between 40 and 80° C. The heating time must fall within a range such that the effect of this invention is achieved and is practically between 5 minutes and 2 hours.

In this invention, the housing member for housing a mask blank is preferably subjected to cleaning prior to the treatment for removing the chemical substance. By preliminarily removing the chemical substance adhered to a surface of the housing member by cleaning, it is possible to reliably improve the effect of removing the chemical substance by the treatment of this invention subsequently carried out. In this case, pure water is preferably used as a cleaning liquid. As the pure water, use is preferably made of reverse osmotic membrane water (hereinafter abbreviated to "RO water") or ultra filtration membrane water (hereinafter abbreviated to "UF water"). If ion exchange is additionally carried out to obtain ion exchanged water (may be called de-ionized water, hereinafter abbreviated to "DI water"), the function of removing the chemical substance from the housing member is further enhanced. The RO water and the DI water have a complementary relationship with respect to chemical substances as main objects to be removed. Therefore, pure water subjected to RO treatment and then to DI treatment (hereinafter abbreviated to "RO/DI water") achieves a more desirable effect. By cleaning the above-mentioned member using such pure water, it is possible to remove the chemical substance and to prevent contamination by the cleaning liquid. Thus, cleaning with the pure water is especially preferable in order to maintain the performance of the chemically amplified resist film of the mask blank to be housed.

In case where the cleaning is carried out by the use of the pure water mentioned above, the cleaning is preferably carried out by bringing the housing member into contact with heated pure water because a more desirable effect is obtained. In this case, the temperature of the pure water is selected within a temperature region higher than the room temperature and lower than a boiling point. Practically, the temperature region between 40 and 90° C., particularly between 40 and 80° C. may be used.

In this invention, in order to improve the effect of removing the chemical substance, the above-mentioned cleaning and the treatment for removing the chemical substance according to this invention may be repeated a plurality of number of times.

The treatment for removing the chemical substance according to this invention is preferably carried out in a cleaned environment. In particular, use is preferably made of an atmosphere from which the acidic substance or the basic substance contaminating the chemically amplified resist film is removed. This is because the chemical substance contained in the atmosphere is prevented from being adhered to the housing member during the treatment of the housing member. In order to remove the acidic substance from the atmosphere, a filter (chemical filter) for adsorbing the chemical substance may be used. As the chemical filter for removing the acidic substance, use is preferably made of a chemical filter mixed with an acid-neutralizing substance.

As the acid-neutralizing substance, carbonate is preferable. As the carbonate, potassium carbonate is preferable. Preferably, an activated carbon filter containing an adsorber such as activated carbon is used as the above-mentioned chemical filter. Preferably, a filter comprising the adsorber, such as activated carbon, mixed with the acid-neutralizing substance is used as the above-mentioned chemical filter. Preferably, a basic chemical substance, such as ammonia and amine, which inhibits a desired chemically amplifying effect of the chemically amplified resist is removed together with the acidic substance. In order to remove the basic chemical substance, use may be made of a method of using a chemical filter mixed with an alkali-neutralizing substance, such as phosphoric acid.

It is preferable to use an air filter in combination with the chemical filter for removing the acidic substance or the basic substance. Preferably, such an air filter may be a HEPA filter (high efficiency particulate air filter) or an ULPA filter (ultra low penetration particulate air filter). As an ability of the air filter, it is preferable to trap particles having a diameter of 0.05 μm or more.

In this invention, the housing member for housing a mask blank may be a member for housing and holding the mask blank (such as an inner case of the container), a member for housing and storing the mask blank (such as the container), and the like.

In this invention, a material of the housing member for housing a mask blank is not particularly restricted. Preferably, however, a resin material light in weight and easy in handling is used. The resin material contains a high-molecular-weight compound as a main component and an added substance added upon synthesis, an unreacted substance, a low-molecular-weight compound, and so on. Even at a relatively low temperature, a large amount of outgas tends to be released with lapse of time. Under the circumstances, this invention is highly useful. Such a resin material may be polypropylene resin, acryl resin, polyethylene resin, polybutylene resin, or polycarbonate resin. Among others, acryl resin, particularly, polymethyl methacrylate (PMMA) resin is a material releasing a relatively small amount of outgas. Therefore, by applying this invention, it is possible to maintain an excellent performance of the chemically amplified resist film formed on the mask blank housed and stored. This invention is applicable not only to the case where the mask blank is held in a vertical direction but also to the case where the mask blank is supported in a horizontal or an oblique direction.

DESCRIPTION OF THE PREFERRED EMBODIMENTS

First Embodiment

Now, referring to FIGS. 1 through 5, a first embodiment of this invention will be described.

Figure 4:
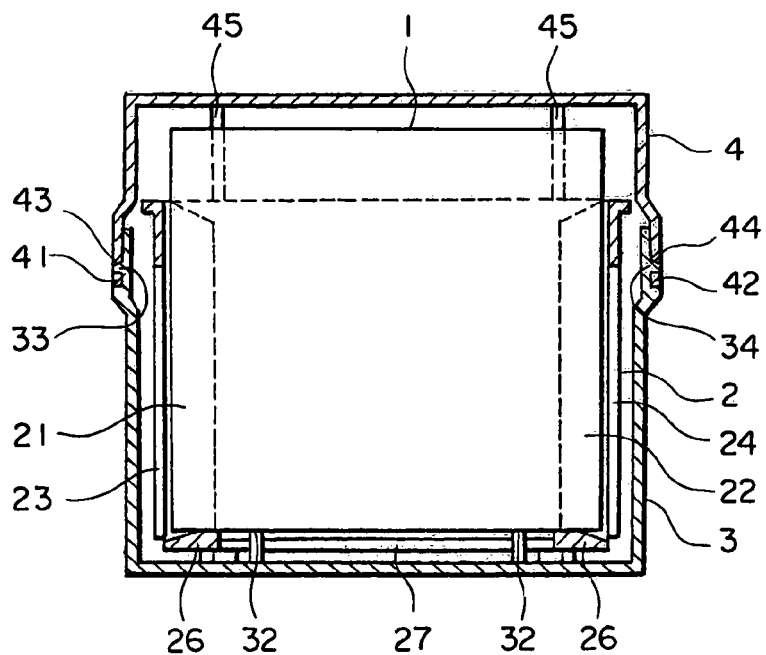
FIG. 4 is a vertical sectional view of the container in which the mask blank is housed.

A container according to the first embodiment is adapted to receive a mask blank 1 comprising a glass substrate having a principal surface of a square shape, a light shielding thin film, such as a chromium film, deposited on one principal surface of the glass substrate, and a chemically amplified resist film formed on the thin film. The container comprises an inner case 2 for housing the mask blank 1, a container body 3 for housing the inner case 2, and a cap 4 to be put on the container body 3 on the side of an opening of the container body 3 (FIG. 4).

It is noted here that the mask blank 1 may be directly housed in the container body 3 provided with a groove or the like without using the inner case 2. However, use of the inner case 2 in this embodiment is convenient because several to several tens of mask blanks held in the inner case 2 can collectively be handled.

The inner case 2 in this embodiment is provided with a plurality of pairs of grooves 21 and 22 formed on a pair of opposite inner side surfaces opposite to each other in a first direction, respectively, in parallel to one another at a predetermined interval and extending from the opening (upper side) towards a bottom surface (lower side) of he inner case 2.

Figure 2:
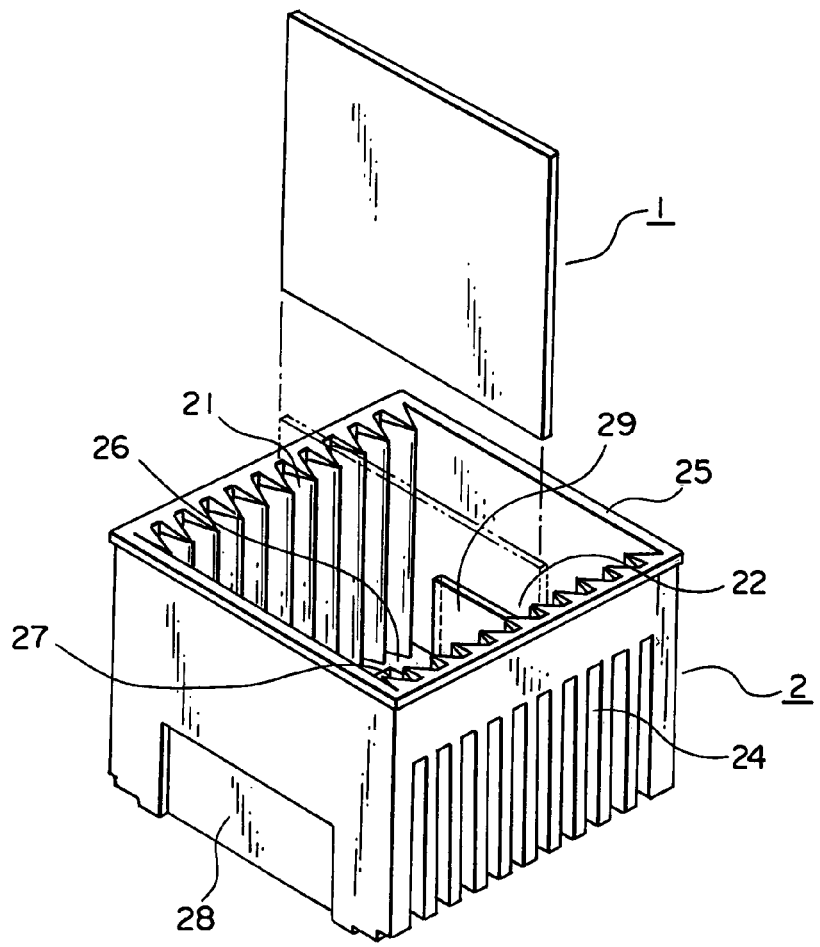
FIG. 2 is a perspective view showing a state where a mask blank is housed in an inner case.

The grooves 21 and 22 are provided with opening windows 23 and 24 formed at lower portions adjacent the bottom surface of the inner case 2, respectively. The bottom surface of the inner case 2 is provided with an opening portion 27. Further, the bottom surface of the inner case 2 is provided with a substrate supporting portion 26 which supports a lower end face of the mask blank 1 (FIGS. 2 and 4). In order to house and fix the inner case 2 in the container body 3, a pair of depressed portions 28 and 29 are formed on a pair of opposite outer side surfaces of the inner case 2 opposite to each other in the second direction perpendicular to the first direction, respectively, and extend from the bottom surface to an intermediate position towards the opening (FIG. 2). A height of the inner case 2 from an upper end face 25 adjacent to the opening to the substrate supporting portion 26 corresponds to a major part of a height of the mask blank 1 housed in the inner case 2. When the mask blank 1 is housed in the inner case 2, an upper part of the mask blank 1 protrudes from the upper end face 25 of the inner case 2 (FIG. 4). When several mask blanks 1 are inserted into the inner case 2 along pairs of grooves 21 and 22, the mask blanks 1 stand in parallel to one another at the predetermined interval. The mask blanks 1 stand in a vertical direction in this embodiment but may stand in an oblique direction.

Figure 3:
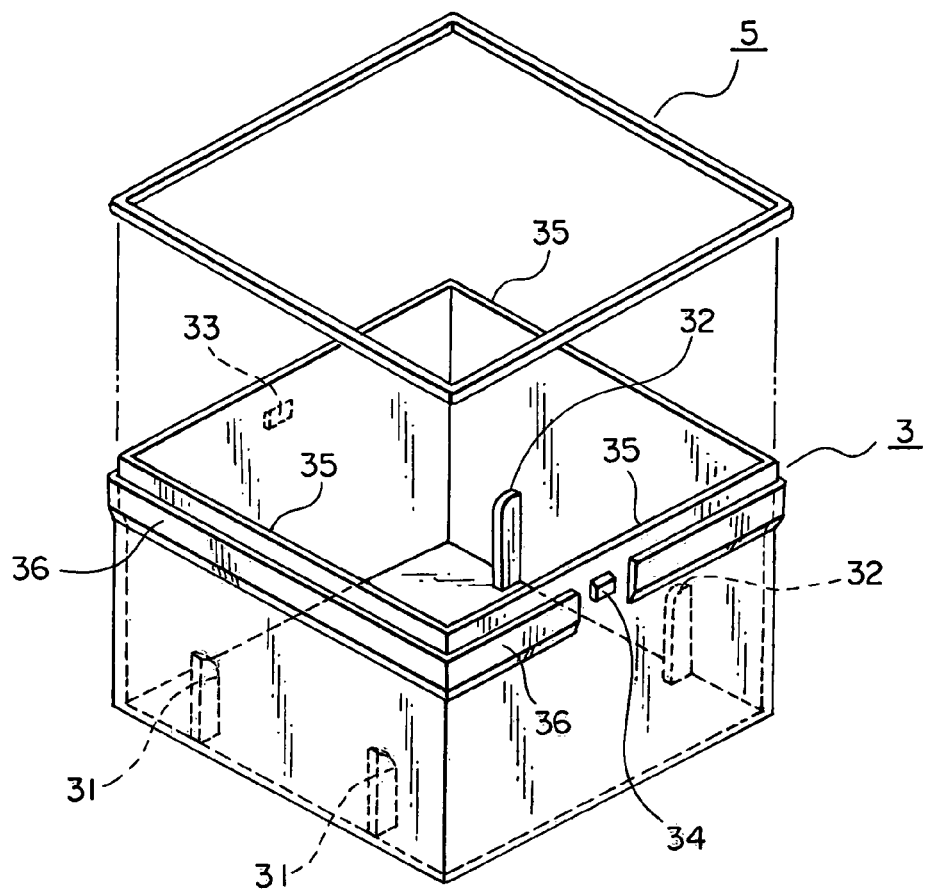
FIG. 3 is a perspective view of a container body (outer case) of the container.

The container body 3 in this embodiment is provided with protruding portions 31 and 32 formed on a pair of opposite inner side surfaces opposite to each other in the second direction and adapted to be brought into contact with the depressed portions 28 and 29 of the inner case 2. The protruding portions 31 and 32 have bottom portions connected to the bottom surface of the container body 3 (FIG. 3). On a pair of opposite outer side surfaces opposite to each other in the first direction, projecting portions 33 and 34 are formed near the opening, respectively. The projecting portions 33 and 34 have projecting surfaces substantially flush with an outer peripheral surface 36 continuously formed at a position slightly below an opening edge 35 of the container body 3.

Figure 1:
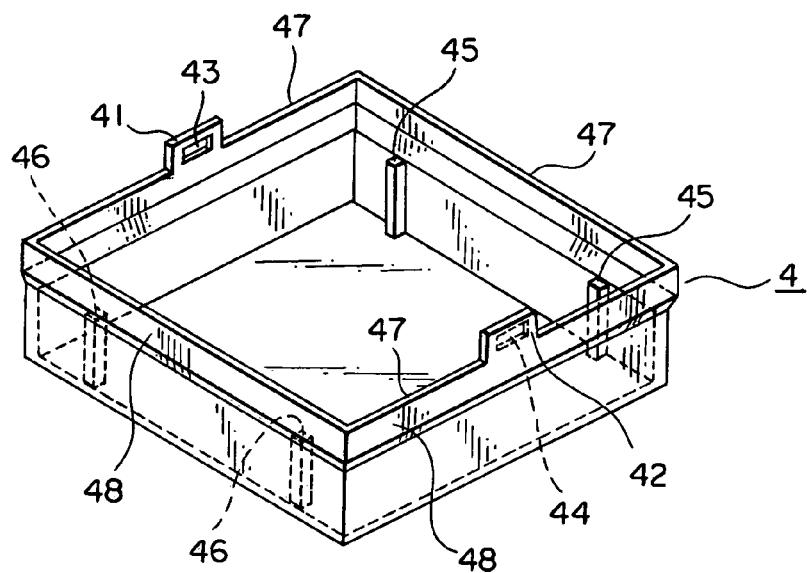
FIG. 1 is a perspective view of a cap of a container according to an embodiment of this invention.

The cap 4 in this embodiment has engaging portions 41 and 42 extending from a pair of opposite lower edges 47 thereof (i.e., opening edges to be fitted to the container body 3 and turned upside in FIG. 1) and provided with recessed portions 43 and 44, respectively. With this structure, when the cap 4 is put on the container body 3, the recessed portions 43 and 44 are engaged with the projecting portions 33 and 34 of the container body 3, respectively, so that the cap 4 and the container body 3 are fixed to each other (FIG. 4). The cap 4 is further provided with stoppers 45 and 46 formed on a pair of inner side surfaces opposite to each other in the second direction and faced to each other (FIG. 1). The stoppers 45 and 46 are adapted to be butted against the upper end face 25 of the inner case 2 on the side of the opening to support and fix the inner case 2 in the vertical direction. It is noted here that the cap 4 may be directly put on the container body 3 without forming the recessed portions 43 and 44 of the cap 4 and the projecting portions 33 and 34 of the container body 3. In case where the recessed portions 43 and 44 of the cap 4 and the projecting portions 33 and 34 of the container body 3 are engaged with each other as engaging means, such engaging means may be formed not only on a pair of opposite side surfaces but on all four side surfaces.

Each of the inner case 2, the container body 3, and the cap 4 may be made of a resin material appropriately selected from, for example, polypropylene, acryl, polyethylene, polycarbonate, polyester, polyamide, polyimide, and polyethylene sulfide. Among others, polycarbonate or polyester is preferable. As a material of each of the container body 3 and the cap 4, polycarbonate is preferable. As a material of the inner case 2, polyester is preferable. As polyester, polyethylene terephthalate (PET) or polybutylene terephthalate (PBT) is preferable. If electric charges are accumulated during storage of the mask blank, discharge breakdown may occur during a mask manufacturing process to cause pattern defects. In view of the above, it is preferable to impart conductivity to the container body 3, for example, by mixing carbon in the resin material constituting the container body 3. It is also preferable to impart conductivity by applying a conductive polymer film onto a surface of the container body 3.

Figure 5:
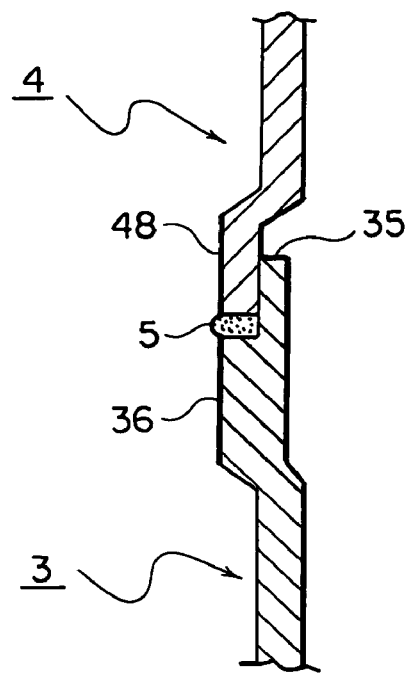
FIG. 5 is an enlarged vertical sectional view showing a joint portion between the cap and the container body.

In this embodiment, an annular elastic member 5 is fitted along the outer peripheral surface 36 continuous from the opening edge 35 of the container body 3 (FIG. 3). When the cap 4 is put on the container body 3 and the recessed portions 43 and 44 of the cap 4 are engaged with the projecting portions 33 and 34 of the container body 3 so that the cap 4 and the container body 3 are fixed to each other, an outer peripheral surface 48 continuous from the lower edge of the cap 4 and the outer peripheral surface 36 continuous from the opening edge of the container body 3 overlap each other frontward and rearward and are connected to each other as illustrated in FIG. 5. Further, the elastic member 5 is interposed at a joint portion therebetween so that the interior of the container can be hermetically sealed.

As the elastic member 5, it is desired to use a material which release only a small amount of a chemical component gas even upon occurrence of change in temperature or pressure of the atmosphere. For example, a packing material, such as polyolefin elastomer and polyester elastomer, is particularly preferable. Further, a silicone rubber may be used as far as release of a gas component is small.

The elastic member 5 may have a rectangular section or a circular section. The thickness or the width of the elastic member 5 can not be definitely mentioned. However, if the thickness or the width is excessively large, the cap 4 is difficult to be fitted and removed. On the other hand, if the thickness or the width is excessively small, tight contact between the elastic member 5 and the joint portion between the cap 4 and the container body 3 may be incomplete so that the function of hermetically sealing the interior of the container is difficult to obtain. Therefore, the thickness or the width of the elastic member 5 may appropriately be determined depending upon the size of the container and the shape and the size of the joint portion.

In this embodiment, the elastic member 5 having an annular shape and an appropriate size is fitted to the opening edge of the container body 3. Alternatively, the elastic member may preliminarily be adhered.

As described above, in the container according to this embodiment, the elastic member 5 is interposed between the cap 4 and the container body 3 at the joint portion when the cap 4 is put on the container body 3. Thus, the container can be hermetically sealed. Therefore, it is possible to store the mask blank for a long period of time while maintaining a clean atmosphere upon housing the mask blank and to prevent ambient air from entering the interior of the container to cause contamination by a chemical component or the like contained in the ambient air. Therefore, this invention is suitable for housing a mask blank having a chemically amplified resist film susceptible to an influence of a storage environment and required to be stored in an especially clean atmosphere.

Figure 6:
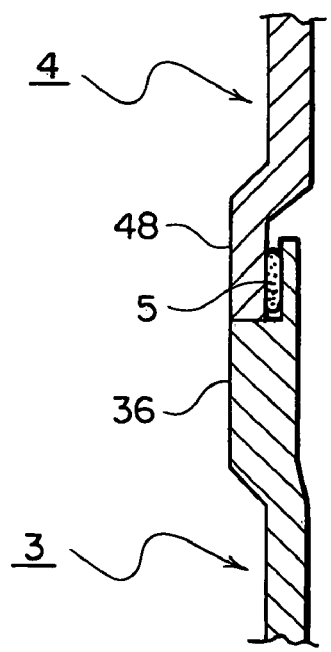
FIG. 6 is a view similar to FIG. 5 but showing a modification of the container.

Referring to FIG. 6, a container according to a modification of the first embodiment is similar in structure to the first embodiment except that the elastic member 5 is formed at a different position of the container body 3. Specifically, the elastic member 5 is interposed at a joint surface between the outer peripheral surface 48 continuous from the lower edge of the cap 4 and the outer peripheral surface 36 continuous from the opening edge of the container body 3 when the cap 4 is put on the container body 3.

Figure 7:
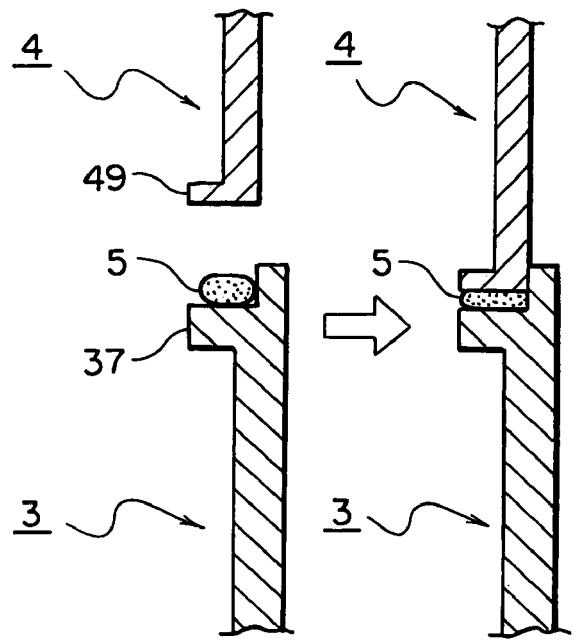
FIG. 7 is a view similar to FIG. 5 but showing another modification of the container.

Referring to FIG. 7, a container according to another modification is similar in structure to the first embodiment except that the lower edge of the cap 4 is provided with a flange 49 while the opening edge of the container body 3 is provided with a flange 37. When the cap 4 is put on the container body 3 and fixed, the flanges 49 and 37 are connected to each other with the elastic member 5 interposed therebetween.

Figure 8:
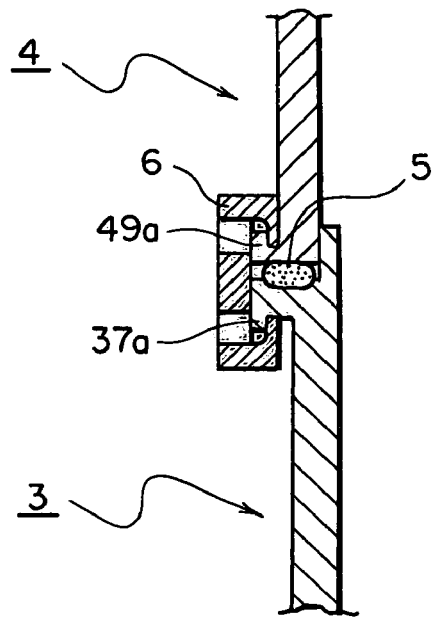
FIG. 8 is a view similar to FIG. 5 but showing still another modification of the container.

Referring to FIG. 8, a container according to still another modification is similar to that in FIG. 7 except that the flange 49 at the opening edge of the container body 3 is provided with a recessed portion to bury a part of the elastic member 5.

In case where the flanges are overlapped and connected, use may be made of a locking member 6 (see FIG. 8) for clamping the joint portion from upper and lower sides. By merely sliding the locking member 6 along the flanges, the joint portion can be fixed and locked. Therefore, the use of the locking member 6 is advantageous in that the cap 4 can easily be fitted and removed, for example, by robotic manipulation. In order to avoid the locking member 6 from being deviated from a sliding direction, it is desired that, in a locking portion of the joint portion, the flange of the cap 4 is provided with a protrusion 49a extending upward from an end of the flange while the flange of the container body 3 is provided with a protrusion 37a extending downward from an end of the flange.

In each of the first embodiment and the modifications thereof, the elastic member is formed on the container body. Not being limited thereto, the elastic member may be adhered to the cap. Alternatively, the elastic member may be formed on each of the container body and the cap. In any event, the effect of this invention is advantageously achieved.

As will readily be understood, this invention is applicable not only to a mask blank having a square shape but also to a case where a substrate of a different shape, such as a disk-like shape, is housed.

Hereinafter, this invention will be described in conjunction with a specific example.

EXAMPLE

A half tone film was formed on a quartz substrate by sputtering. On the half tone film, a resist film was formed by spin coating to produce a mask blank with a resist film. As the half tone film, a MoSi metal film was used. As the resist film, a chemically amplified resist film of a positive type was used.

Ten mask blanks were produced in the above-mentioned manner and housed in the container according to the first embodiment illustrated in FIGS. 1 through 5. Each of the cap and the container body was made of polycarbonate. The inner case was made of polybutylene terephthalate. As the elastic member, an annular packing member of polyolefin elastomer was used. A housing operation was carried out in a clean room cleaned by an activated carbon filter and an ULPA filter.

The container was packaged in a package bag and transported by air cargo. The container after transported was opened in a clean room similar to that described above to take out the mask blanks. Each mask blank was subjected to electron beam writing, development, and etching in a predetermined manner to produce a phase-shift transfer mask. The quality of each phase-shift transfer mask thus produced was inspected in detail by the use of a scanning electron microscope. As a result, no serious defect was found in any one of the ten phase-shift masks.

Comparative Example

Mask blanks were produced, housed, and transported in a manner similar to the Example except that a known container without using an elastic member at the joint portion of the container (a cap, a container body, and an inner case were made of materials similar to those in the Example) was used and that an adhesive tape was attached to the joint portion of the container to seal the container after housing the mask blanks.

By the use of the mask blanks after transportation, phase shift masks were produced in the manner similar to the Example. The quality of each phase-shift mask was inspected in detail by the use of a scanning electron microscope. As a result, disturbance in line width of a pattern was observed in each of the ten phase-shift masks. The reason is supposed as follows. Since sealing of the container was incomplete, ambient air entered into the interior of the container during transportation. A certain chemical component in the ambient air chemically contaminated the chemically amplified resist film of the mask blank.

Second Embodiment

Now, referring to FIGS. 2 and 9 through 11, a container for a mask blank according to a second embodiment of this invention will be described.

Figure 11:
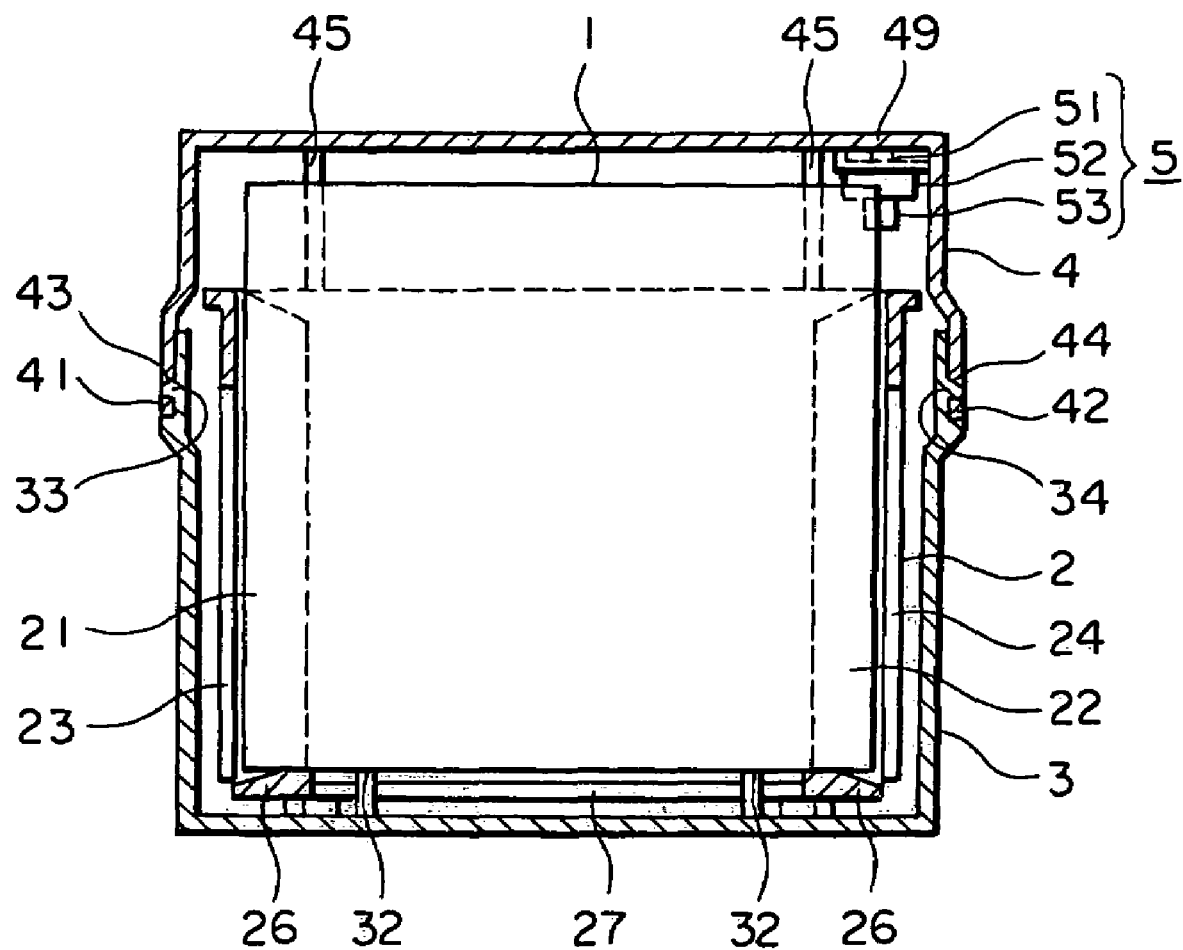
FIG. 11 is a vertical sectional view of the container in which a mask blank is housed.

A container according to the second embodiment is adapted to receive a mask blank 1 comprising a glass substrate having a principal surface of a square shape, a light shielding thin film, such as a chromium film, deposited on one principal surface of the glass substrate, and a chemically amplified resist film formed on the thin film. The container comprises an inner case 2 for housing the mask blank 1, a container body 3 for housing the inner case 2, and a cap 4 to be put on the container body 3 on the side of an opening of the container body 3 (FIG. 11).

It is noted here that the mask blank 1 may be directly housed in the container body 3 provided with a groove or the like without using the inner case 2. However, use of the inner case 2 is convenient because several to several tens of mask blanks held in the inner case 2 can collectively be handled.

The inner case 2 in this embodiment is provided with a plurality of pairs of grooves 21 and 22 formed on a pair of opposite inner side surfaces opposite to each other in a first direction, respectively, in parallel to one another at a predetermined interval and extending from the opening (upper side) towards a bottom surface (lower side) of he inner case 2. The grooves 21 and 22 are provided with opening windows 23 and 24 formed at lower portions adjacent the bottom surface of the inner case 2, respectively. The bottom surface of the inner case 2 is provided with an opening portion 27. Further, the bottom surface of the inner case 2 is provided with a substrate supporting portion 26 which supports a lower end face of the mask blank 1 (FIGS. 2 and 11). In order to house and fix the inner case 2 in the container body 3, a pair of depressed portions 28 and 29 are formed on a pair of opposite outer side surfaces of the inner case 2 opposite to each other in the second direction perpendicular to the first direction, respectively, and extend from the bottom surface to an intermediate position towards the opening (FIG. 2). A height of the inner case 2 from an upper end face 25 adjacent to the opening to the substrate supporting portion 26 corresponds to a major part of a height of the mask blank 1 housed in the inner case 2. When the mask blank 1 is housed in the inner case 2, an upper part of the mask blank 1 protrudes from the upper end face 25 of the inner case 2 (FIG. 11). When several mask blanks 1 are inserted into the inner case 2 along pairs of grooves 21 and 22, the mask blanks 1 stand in parallel to one another at the predetermined interval. The mask blanks 1 stand in a vertical direction in this embodiment but may stand in an oblique direction.

Figure 10:
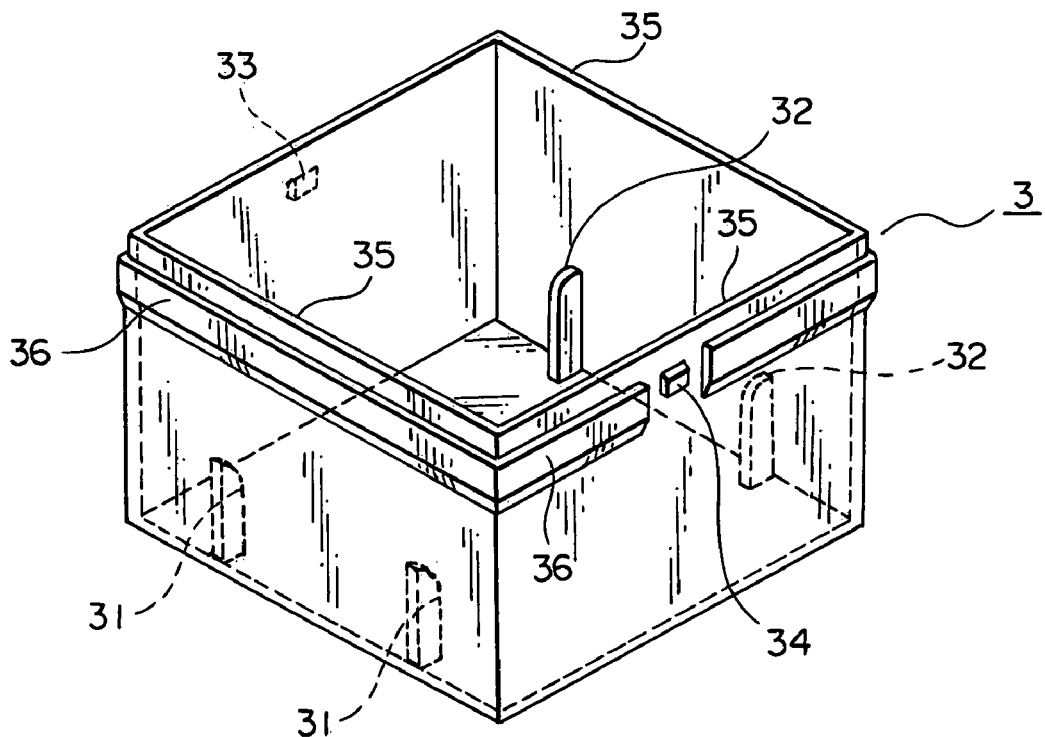
FIG. 10 is a perspective view of a container body (outer case) of the container in FIG. 10.

The container body 3 in this embodiment is provided with protruding portions 31 and 32 formed on a pair of opposite inner side surfaces opposite to each other in the second direction and adapted to be brought into contact with the depressed portions 28 and 29 of the inner case 2. The protruding portions 31 and 32 have bottom portions connected to the bottom surface of the container body 3 (FIG. 10). On a pair of opposite outer side surfaces opposite to each other in the first direction, projecting portions 33 and 34 are formed near the opening, respectively. The projecting portions 33 and 34 have projecting surfaces substantially flush with an outer peripheral surface 36 continuously formed at a position slightly below an opening edge 35 of the container body 3.

Figure 9:
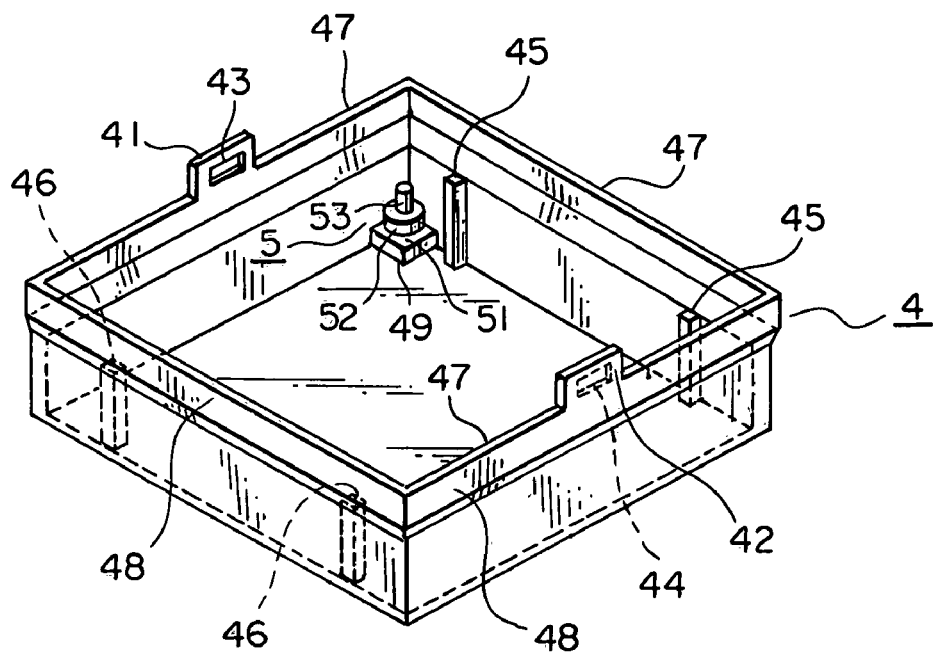
FIG. 9 is a perspective view of a cap of a container according to another embodiment of this invention.

The cap 4 in this embodiment has engaging portions 41 and 42 extending from a pair of opposite lower edges 47 thereof (i.e., opening edges to be fitted to the container body 3 and turned upside in FIG. 9) and provided with recessed portions 43 and 44, respectively. With this structure, when the cap 4 is put on the container body 3, the recessed portions 43 and 44 are engaged with the projecting portions 33 and 34 of the container body 3, respectively, so that the cap 4 and the container body 3 are fixed to each other (FIG. 11). The cap 4 is further provided with stoppers 45 and 46 formed on a pair of inner side surfaces opposite to each other in the second direction and faced to each other (FIG. 9). The stoppers 45 and 46 are adapted to be butted against the upper end face 25 of the inner case 2 on the side of the opening to support and fix the inner case 2 in the vertical direction. It is noted here that the cap 4 may be directly put on the container body 3 without forming the recessed portions 43 and 44 of the cap 4 and the projecting portions 33 and 34 of the container body 3. In case where the recessed portions 43 and 44 of the cap 4 and the projecting portions 33 and 34 of the container body 3 are engaged with each other as engaging means, such engaging means may be formed not only on a pair of opposite side surfaces but on all four side surfaces.

Each of the inner case 2, the container body 3, and the cap 4 may be made of a resin material appropriately selected from, for example, polypropylene, acryl, polyethylene, polycarbonate, polyester, polyamide, polyimide, and polyethylene sulfide. Among others, polycarbonate or polyester is preferable. As a material of each of the container body 3 and the cap 4, polycarbonate is preferable. As a material of the inner case 2, polyester is preferable. As polyester, polyethylene terephthalate (PET) or polybutylene terephthalate (PBT) is preferable. If electric charges are accumulated during storage of the mask blank, discharge breakdown may occur during a mask manufacturing process to cause pattern defects. In view of the above, it is preferable to impart conductivity to the container body 3, for example, by mixing carbon in the resin material constituting the container body 3.

When the cap 4 is put on the container body 3 and the recessed portions 43 and 44 of the cap 4 are engaged with the projecting portions 33 and 34 of the container body 3 so that the cap 4 and the container body 3 are fixed to each other, an outer peripheral surface 48 continuous from the lower edge of the cap 4 and the outer peripheral surface 36 continuous from the opening edge of the container body 3 overlap each other frontward and rearward and are connected to each other.

In this embodiment, the cap 4 is provided with a vent hole 49 formed at one corner thereof to allow communication between the ambient air and the internal air. The vent hole 49 is provided with a filtering member 5' faced to the inside of the cap 4 (FIGS. 9 and 11). The filtering member 5' comprises a filter holding portion 52 having a flange-like shape and holding an internal filter, pipes 51 and 53 integrally connected to the filter holding portion 52 on opposite sides thereof to serve as a gas flow path. In this embodiment, the pipe 51 is attached to the vent hole 49 of the cap 4 while the pipe 53 faces the inside of the cap 4. The filter holding portion 52 can be divided so as to mount and remove the internal filter. The corner of the cap 4 provided with the vent hole 49 is depressed inward and the filter holding portion 52 is brought into contact with the depressed portion.

Even if the ambient air enters through the vent hole 49 in the state where the mask blanks are housed and stored in the container according to this embodiment, foreign matters such as a chemical substance contained in the ambient air can be removed by the filtering member 5' and cleaned ambient air alone enters the interior of the container. Therefore, cleanliness in the container is maintained.

As the filter of the filtering member 5', use may be made of, for example, an air filter generally used in a clean room. Preferably, such a filter may be a HEPA filter (high efficiency particulate air filter) or an ULPA filter (ultra low penetration particulate air filter). The HEPA filter is a high-efficiency air filter mainly used for air purification in a clean room and is generally made of a glass fiber material. The ULPA filter is an ultra-high performance filter developed following the development of the fine process technology in ULSI manufacture and is generally made of a glass fiber or a fluorine-based resin material. As an ability of the air filter, it is preferable to trap particles having a diameter of 0.05 μm or more. The air filter such as the HEPA filter or the ULPA filter may be appropriately selected taking into account cost effectiveness and the like. Practically, the HEPA filter may be used.

In case where a mask blank having a chemically amplified resist film especially required to eliminate contamination by a chemical substance is housed and stored, it is preferable to use a filter for adsorbing the chemical substance (chemical filter), alone or in combination with the above-mentioned air filter. As the chemical filter, for example, an activated carbon filter or an ion exchange filter may preferably be used. The chemical filter such as the activated carbon filter or the ion exchange filter may be appropriately selected taking into account cost effectiveness and the like. Practically, the activated carbon filter may be used.

The chemical substance contaminating the chemically amplified resist, i.e., inhibiting a desired chemically amplifying effect of the chemically amplified resist (the chemically amplifying effect is enhanced or suppressed as compared with a desired extent and a predetermined resist pattern can not be formed) includes an acidic chemical substance and a basic chemical substance. The acidic chemical substances may be a substance containing chlorine ions, a substance containing sulfate ions, a substance containing phosphate ions, or a substance containing nitrate ions. The basic chemical substance may be a compound containing nitrogen, such as ammonia, amine, aniline, or nitrile, which suppresses or inhibits (for example, deactivates) the function of an acid as a catalyst for the chemically amplifying reaction.

As described above, in the container according to this embodiment, even if the ambient air enters through the vent hole 49 while the mask blank is housed and stored, the foreign matters such as the chemical substance contained in the ambient air are prevented by the filtering member 5' from entering the interior of the container. Therefore, it is possible to store the mask blank while maintaining a clean atmosphere upon housing the mask blank even for a long period of time and to prevent the ambient air from directly entering the interior of the container to contaminate the mask blank by the foreign matters such as the chemical substance contained in the ambient air. Therefore, this invention is suitable for housing and storing the mask blank having a chemically amplified resist film susceptible to an influence of the storage environment and required to be stored in an especially clean atmosphere.

Generally, the ambient air may enter through the joint portion between the cap 4 and the container body 3, i.e., the joint portion where the outer peripheral surface 48 continuous from the lower edge of the cap 4 and the outer peripheral surface 36 continuous from the opening edge of the container body 3 overlap each other when the cap 4 is put on the container body 3. However, by providing the container with the vent hole 49, the ambient air will preferentially enter through the vent hole 49 so that the contamination of the interior of the container is sufficiently prevented.

In this embodiment, the vent hole 49 and the filtering member 5' are formed at one corner of the cap 4. Not being limited thereto, the vent hole 49 and the filtering member 5' may be formed at any position except the corner as far as the mask blank housed in the container is not contacted therewith. The vent hole 49 and the filtering member 5' may be formed at a plurality of positions, not at one position. Further, the vent hole 49 and the filtering member 5' may be formed not at a top plate of the cap 4 in this embodiment but may be formed at an appropriate position on a side wall plate or on the container body 3.

The means for inhibiting entry of the foreign matters contained in the ambient air into the container is not limited to that in this embodiment. For example, a vent hole is formed at an appropriate position of the container and a filter or a sealing member having a filtering function is directly attached to the vent hole so as to cover or close the vent hole from the inside of the container. Further, without forming the vent hole, a filter or a member having a filtering function may be attached to the joint portion between the cap 4 and the container body 3.

The mask blank to which this invention is applicable includes a mask blank comprising a light transparent substrate such as a glass substrate and a light shielding film such as Cr formed on the substrate, a mask blank used to produce a phase shift mask and comprising a substrate and a half tone (semitransparent) film formed on the substrate, and a mask blank used to produce a reflective mask and comprising a substrate, a reflective film such as a Mo/Si multilayer reflective film for reflecting exposure light, and an absorber film such as a Ta-based absorber film for absorbing the exposure light. As will readily be understood, this invention is applicable not only to a case where a mask blank of a square shape is housed but also to a case where a mask blank of a different shape, such as a disk-like shape, is housed.

Now, this embodiment will be described in conjunction with a specific example.

EXAMPLE

A halftone film was formed on a quartz substrate (6 inch×6 inch) by sputtering. On the halftone film, a resist film was formed by spin coating to produce a mask blank with a resist film. As the halftone film, a MoSi metal film was used. As the resist film, a chemically amplified resist film of a positive type was used.

100 mask blanks were produced in the above-mentioned manner and housed in 10 containers according to the second embodiment described in conjunction with FIGS. 2 and 9 through 11. Each of the cap and the container body was made of polycarbonate. The inner case was made of polybutylene terephthalate. As a filter of a filtering member attached to the container, a combination of the activated carbon filter and the HEPA filter was used. A housing operation was carried out in a clean room cleaned by an activated carbon filter and an ULPA filter.

The container was packaged in a package bag and transported by air cargo. The container after transported was opened in a clean room similar to that described above to take out the mask blanks. Each mask blank was subjected to electron beam writing, development, and etching in a predetermined manner to produce a phase-shift transfer mask. The quality of each phase-shift transfer mask thus produced was inspected in detail by the use of a scanning electron microscope. As a result, no serious defect was found in any one of the 100 phase-shift masks.

Comparative Example

Mask blanks were produced, housed, and transported in a manner similar to the Example except that a known container without providing the container with the vent hole and the filtering member (a cap, a container body, and an inner case were made of materials similar to those in the Example) was used and that an adhesive tape was attached to the joint portion of the container to seal the container after housing the mask blanks.

By the use of the mask blanks after transportation, phase shift masks were produced in the manner similar to the Example. The quality of each phase-shift mask was inspected in detail by the use of a scanning electron microscope. As a result, disturbance in line width of a pattern was observed in each of the 100 phase-shift masks. The reason is supposed as follows. The ambient air entered into the interior of the container during transportation. A certain chemical component in the ambient air chemically contaminated the chemically amplified resist film of the mask blank.

Third Embodiment

Now, referring to FIGS. 1, 2, 4, and 10, a container according to a third embodiment will be described.

The container for housing a mask blank, used in this embodiment, is not specifically limited.

A container according to the third embodiment is adapted to receive a mask blank 1 comprising a glass substrate having a principal surface of a square shape, a light shielding thin film, such as a chromium film, deposited on one principal surface of the glass substrate, and a chemically amplified resist film formed on the thin film. The container comprises an inner case 2 for housing the mask blank 1, a container body 3 for housing the inner case 2, and a cap 4 to be put on the container body 3 on the side of an opening of the container body 3 (FIG. 4).

It is noted here that the mask blank 1 may be directly housed in the container body 3 provided with a groove or the like without using the inner case 2. However, use of the inner case 2 in this embodiment is convenient because several to several tens of mask blanks held in the inner case 2 can collectively be handled.

The inner case 2 is provided with a plurality of pairs of grooves 21 and 22 formed on a pair of opposite inner side surfaces opposite to each other in a first direction, respectively, in parallel to one another at a predetermined interval and extending from the opening (upper side) towards a bottom surface (lower side) of he inner case 2. The grooves 21 and 22 are provided with opening windows 23 and 24 formed at lower portions adjacent the bottom surface of the inner case 2, respectively. The bottom surface of the inner case 2 is provided with an opening portion 27. Further, the bottom surface of the inner case 2 is provided with a substrate supporting portion 26 which supports a lower end face of the mask blank 1 (FIGS. 2 and 4). In order to house and fix the inner case 2 in the container body 3, a pair of depressed portions 28 and 29 are formed on a pair of opposite outer side surfaces of the inner case 2 opposite to each other in the second direction perpendicular to the first direction, respectively, and extend from the bottom surface to an intermediate position towards the opening (FIG. 2). A height of the inner case 2 from an upper end face 25 adjacent to the opening to the substrate supporting portion 26 corresponds to a major part of a height of the mask blank 1 housed in the inner case 2. When the mask blank 1 is housed in the inner case 2, an upper part of the mask blank 1 protrudes from the upper end face 25 of the inner case 2 (FIG. 4). When several mask blanks 1 are inserted into the inner case 2 along pairs of grooves 21 and 22, the mask blanks 1 stand in parallel to one another at the predetermined interval. The mask blanks 1 stand in a vertical direction in this embodiment but may stand in an oblique direction.

The container body 3 is provided with protruding portions 31 and 32 formed on a pair of opposite inner side surfaces opposite to each other in the second direction and adapted to be brought into contact with the depressed portions 28 and 29 of the inner case 2. The protruding portions 31 and 32 have bottom portions connected to the bottom surface of the container body 3 (FIG. 10). On a pair of opposite outer side surfaces opposite to each other in the first direction, projecting portions 33 and 34 are formed near the opening, respectively. The projecting portions 33 and 34 have projecting surfaces substantially flush with an outer peripheral surface 36 continuously formed at a position slightly below an opening edge 35 of the container body 3.

The cap 4 in this embodiment has engaging portions 41 and 42 extending from a pair of opposite lower edges 47 thereof (i.e., opening edges to be fitted to the container body 3 and turned upside in FIG. 1) and provided with recessed portions 43 and 44, respectively. With this structure, when the cap 4 is put on the container body 3, the recessed portions 43 and 44 are engaged with the projecting portions 33 and 34 of the container body 3, respectively, so that the cap 4 and the container body 3 are fixed to each other (FIG. 4). The cap 4 is further provided with stoppers 45 and 46 formed on a pair of inner side surfaces opposite to each other in the second direction and faced to each other (FIG. 1). The stoppers 45 and 46 are adapted to be butted against the upper end face 25 of the inner case 2 on the side of the opening to support and fix the inner case 2 in the vertical direction. It is noted here that the cap 4 may be directly put on the container body 3 without forming the recessed portions 43 and 44 of the cap 4 and the projecting portions 33 and 34 of the container body 3. In case where the recessed portions 43 and 44 of the cap 4 and the projecting portions 33 and 34 of the container body 3 are engaged with each other as engaging means, such engaging means may be formed not only on a pair of opposite side surfaces but on all four side surfaces.

Each of the inner case 2, the container body 3, and the cap 4 may be made of a resin material appropriately selected from, for example, polypropylene, acryl, polyethylene, polycarbonate, polyester, polyamide, polyimide, and polyethylene sulfide. Among others, polycarbonate or polyester is preferable. As a material of each of the container body 3 and the cap 4, polycarbonate is preferable. As a material of the inner case 2, polyester is preferable. As polyester, polyethylene terephthalate (PET) or polybutylene terephthalate (PBT) is preferable. If electric charges are accumulated during storage of the mask blank, discharge breakdown may occur during a mask manufacturing process to cause pattern defects. In view of the above, it is preferable to impart conductivity to the container body 3, for example, by mixing carbon in the resin material constituting the container body 3.

When the cap 4 is put on the container body 3 and the recessed portions 43 and 44 of the cap 4 are engaged with the projecting portions 33 and 34 of the container body 3 so that the cap 4 and the container body 3 are fixed to each other, an outer peripheral surface 48 continuous from the lower edge of the cap 4 and the outer peripheral surface 36 continuous from the opening edge of the container body 3 overlap each other frontward and rearward and are connected to each other.

As described in structure 16, the container preferably has means for absorbing or adsorbing an acidic substance. Even if the mask blank is housed in the container together with an atmosphere from which the acidic substance is removed, the acidic substance may enter together with the ambient air through the joint portion between the cap and the container body of the container during transportation and storage of a mask blank package obtained by housing the mask blank in the container. Even in this event, if the container has means for absorbing or adsorbing the acidic substance, the acidic substance contained in the ambient air can be removed and the interior of the container can be kept at a clean atmosphere. As the means for absorbing or adsorbing the acidic substance, for example, it is a simple method to dispose a material for absorbing or adsorbing the acidic substance (absorber or adsorber for the acidic substance) in the container. As the material for absorbing or adsorbing the acidic substance, use may be made of, for example, carbonate such as potassium carbonate. Alternatively, the material for absorbing or adsorbing the acidic substance may be contained in a material constituting the container. Further, an adsorber such as activated carbon may be used in combination.

As described in structure 17, the mask blank package according to this invention is obtained by housing the mask blank having a chemically amplified resist film in the container having an atmosphere which does not contain at least the acidic substance. The phrase "does not contain the acidic substance" is not restricted to the case where the acidic substance is not present in the atmosphere at all but may be the case where a small amount of the acidic substance is contained in the atmosphere as far as the chemically amplified resist is not contaminated. A specific allowance value in case where the acidic substance is contained in the atmosphere is equivalent to the degree of removal of the acidic substance mentioned above.

As described above, the atmosphere from which the acidic substance is removed may be used upon housing the mask blank. Further, the above-mentioned atmosphere is preferably used also in a manufacturing process of the mask blank. Specifically, as described in structure 18, a thin film for forming a mask pattern is deposited on a substrate such as a glass substrate and, thereafter, a chemically amplified resist film is formed on the thin film under an atmosphere from which at least an acidic substance is removed. Thus, it is possible to prevent adhesion of the acidic substance in the stage of manufacture of the mask blank with a resist film It is suitable to use the above-mentioned atmosphere in a series of steps from manufacture of the mask blank to housing and packaging. Specifically, as described in structure 19, in a series of steps including a resist forming step of forming a chemically amplified resist film on a mask blank obtained by depositing on a substrate a thin film for forming a mask pattern, a post-treating step as an optional step for treating the mask blank with the resist film, an inspection step as an optional step for inspecting the mask blank with the resist film, and a housing/packaging step of housing and packaging the mask blank with the resist film in a container, at least one step is preferably carried out under an atmosphere from which at least the acidic substance is removed. For example, the post-treating step as an optional step is a heating (baking) step for improving adhesiveness of the resist film or a dry cleaning step.

In particular, a series of steps from the resist forming step of forming the chemically amplified resist film on the mask blank to the housing/packaging step of housing and packaging the mask blank with a resist film are suitably carried out under the atmosphere from which at least the acidic substance is removed.

The mask blank to which this invention is applicable includes a mask blank comprising a light transparent substrate such as a glass substrate and a light shielding film such as Cr formed on the substrate, a mask blank used to produce a phase shift mask and comprising a substrate and a half tone (semitransparent) film formed on the substrate, and a mask blank used to produce a reflective mask and comprising a substrate, a reflective film such as a Mo/Si multilayer reflective film for reflecting exposure light, and an absorber film such as a Ta-based absorber film for absorbing the exposure light.

According to this invention, the atmosphere from which at least the acidic substance is removed is used upon housing the mask blank having a chemically amplified resist film into the container. In this manner, it is possible to prevent contamination due to adhesion of the acidic substance, which affects a desired chemically amplifying effect of the chemically amplified resist and excessively enhances the chemically amplifying effect. Therefore, a stable resist performance is assured even after storage of the mask blank. As a result, upon manufacture of a mask, a stable resist pattern is formed and a high-quality transfer mask is obtained with a desired mask pattern. According to this invention, even if the mask blank package as a combination of the container and the mask blank having a chemically amplified resist film and housed in the container is transported to a remote place by the use of traffic means, contamination of the resist film of the mask blank housed therein can be suppressed. Therefore, it is possible to assure high reliability in transportation of the mask blank to a remote place.

According to this invention, after the thin film for forming a mask pattern is deposited on the substrate, the chemically amplified resist film is formed on the thin film under the atmosphere from which at least the acidic substance is removed. In this manner, it is possible to prevent adhesion of the acidic substance in the stage of manufacture of the mask blank with a resist film.

In a series of steps from manufacture of the mask blank to housing and packaging, the atmosphere from which the acidic substance is removed is used. In this manner, it is possible to advantageously prevent contamination by the acidic substance.

Now, the third embodiment will be described in conjunction with a specific example.

EXAMPLE

A halftone film was formed on a quartz substrate (6 inch×6 inch) by sputtering. On the halftone film, a resist film was formed by spin coating to produce a mask blank with a resist film. As the halftone film, a MoSi metal film was used. As the resist film, a chemically amplified resist film of a positive type was used. The resist film was formed in a clean room cleaned by an activated carbon filter containing potassium carbonate and an ULPA filter.

100 mask blanks were manufactured in the above-mentioned manner and housed in 10 containers having the structure illustrated in FIGS. 1 through 4. Each of the cap and the container body was made of polycarbonate. The inner case was made of polybutylene terephthalate. A housing operation was carried out in a clean room cleaned by an activated carbon filter and an ULPA filter. As the activated carbon filter, a combination of an activated carbon filter containing potassium carbonate and an activated carbon filter containing phosphoric acid was used.

The container was packaged in a package bag and transported by air cargo. The container after transported was opened in a clean room similar to that described above to take out the mask blanks. Each mask blank was subjected to electron beam writing, development, and etching in a predetermined manner to produce a phase-shift transfer mask. The quality of each phase-shift transfer mask thus produced was inspected in detail by the use of a scanning electron microscope. As a result, no serious defect was found in any one of the 100 phase-shift masks Comparative Example Mask blanks were produced, packaged, and transported in the manner similar to the Example except that the activated carbon filter containing potassium carbonate was not used in the clean room.

By the use of the mask blanks after transportation, phase shift masks were produced in the manner similar to the Example. The quality of each phase-shift mask was inspected in detail by the use of a scanning electron microscope. As a result, disturbance in line width of a pattern was observed in each of the 100 phase-shift masks. The reason is supposed as follows. Specifically, a certain acidic substance was present in the atmosphere within the clean room and trapped in the container. In this state, the mask blanks were packaged. During transportation, the chemically amplified resist film of the mask blank was chemically contaminated by the acidic substance.

Fourth Embodiment

Now, referring to FIGS. 1, 2, 4, and 10, a fourth embodiment of this invention will be described.

At first, as a housing member to which this invention is applicable, description will be made of an example of a container for housing a mask blank.

A container according to the fourth embodiment is adapted to receive a mask blank 1 comprising a glass substrate having a principal surface of a square shape, a light shielding thin film, such as a chromium film, deposited on one principal surface of the glass substrate, and a chemically amplified resist film formed on the thin film. The container comprises an inner case 2 for housing the mask blank 1, a container body 3 for housing the inner case 2, and a cap 4 to be put on the container body 3 on the side of an opening of the container body 3 (FIG. 4).

It is noted here that the mask blank 1 may be directly housed in the container body 3 provided with a groove or the like without using the inner case 2. However, use of the inner case 2 in this embodiment is convenient because several to several tens of mask blanks held in the inner case 2 can collectively be handled.

The inner case 2 is provided with a plurality of pairs of grooves 21 and 22 formed on a pair of opposite inner side surfaces opposite to each other in a first direction, respectively, in parallel to one another at a predetermined interval and extending from the opening (upper side) towards a bottom surface (lower side) of he inner case 2. The grooves 21 and 22 are provided with opening windows 23 and 24 formed at lower portions adjacent the bottom surface of the inner case 2, respectively. The bottom surface of the inner case 2 is provided with an opening portion 27. Further, the bottom surface of the inner case 2 is provided with a substrate supporting portion 26 which supports a lower end face of the mask blank 1 (FIGS. 2 and 4). In order to house and fix the inner case 2 in the container body 3, a pair of depressed portions 28 and 29 are formed on a pair of opposite outer side surfaces of the inner case 2 opposite to each other in the second direction perpendicular to the first direction, respectively, and extend from the bottom surface to an intermediate position towards the opening (FIG. 2). A height of the inner case 2 from an upper end face 25 adjacent to the opening to the substrate supporting portion 26 corresponds to a major part of a height of the mask blank 1 housed in the inner case 2. When the mask blank 1 is housed in the inner case 2, an upper part of the mask blank 1 protrudes from the upper end face 25 of the inner case 2 (FIG. 4). When several mask blanks 1 are inserted into the inner case 2 along pairs of grooves 21 and 22, the mask blanks 1 stand in parallel to one another at the predetermined interval. The mask blanks 1 stand in a vertical direction in this embodiment but may stand in an oblique direction.

The container body 3 is provided with protruding portions 31 and 32 formed on a pair of opposite inner side surfaces opposite to each other in the second direction and adapted to be brought into contact with the depressed portions 28 and 29 of the inner case 2. The protruding portions 31 and 32 have bottom portions connected to the bottom surface of the container body 3 (FIG. 10). On a pair of opposite outer side surfaces opposite to each other in the first direction, projecting portions 33 and 34 are formed near the opening, respectively. The projecting portions 33 and 34 have projecting surfaces substantially flush with an outer peripheral surface 36 continuously formed at a position slightly below an opening edge 35 of the container body 3.

The cap 4 in this embodiment has engaging portions 41 and 42 extending from a pair of opposite lower edges 47 thereof (i.e., opening edges to be fitted to the container body 3 and turned upside in FIG. 1) and provided with recessed portions 43 and 44, respectively. With this structure, when the cap 4 is put on the container body 3, the recessed portions 43 and 44 are engaged with the projecting portions 33 and 34 of the container body 3, respectively, so that the cap 4 and the container body 3 are fixed to each other (FIG. 4). The cap 4 is further provided with stoppers 45 and 46 formed on a pair of inner side surfaces opposite to each other in the second direction and faced to each other (FIG. 1). The stoppers 45 and 46 are adapted to be butted against the upper end face 25 of the inner case 2 on the side of the opening to support and fix the inner case 2 in the vertical direction.

As described above, the material of each of the inner case 2, the container body 3, and the cap 4 is preferably a resin material. Among others, a PMMA resin is preferable. Each of these members is subjected to treatment for removing the chemical substance, such as heat treatment, according to this invention before the mask blank is housed. If electric charges are accumulated during storage of the mask blank, discharge breakdown may occur during a mask manufacturing process to cause pattern defects. In view of the above, it is possible to impart conductivity to the container body 3, for example, by mixing carbon in the resin material constituting the container body 3.

When the cap 4 is put on the container body 3 and the recessed portions 43 and 44 of the cap 4 are engaged with the projecting portions 33 and 34 of the container body 3 so that the cap 4 and the container body 3 are fixed to each other, an outer peripheral surface 48 continuous from the lower edge of the cap 4 and the outer peripheral surface 36 continuous from the opening edge of the container body 3 overlap each other frontward and rearward and are connected to each other.

As described in structure 23, a member which has been formed as a housing member may be subjected to the treatment for removing the chemical substance or a material before formed into the housing member may be subjected to the treatment for removing the chemical substance. Further, it is possible both the material before formed into the housing member and the housing member after forming are subjected to the treatment for removing the chemical substance.

As described in structure 24, the treating method according to this invention is applicable to a method of manufacturing a mask blank housing member. In this case, this invention is applicable to a method of producing a housing member by treating the housing member as a formed product by the method of this invention or to a method of producing a recycled housing member by treating a used housing member by the method of this invention. Specifically, the treating method of this invention is applicable to a method of producing a mask blank container by forming a resin material and to a method of producing a recycled mask blank container by treating a used mask blank container, which has been used once or more, by the method of this invention.

As described in structure 25, a mask blank package according to this invention is obtained by housing a mask blank with a chemically amplified resist film in a member subjected to a treatment for removing a chemical substance inhibiting a chemically amplifying effect of the chemically amplified resist.

The mask blank to which this invention is applicable is not specifically limited but includes a mask blank comprising a light transparent substrate such as a glass substrate and a light shielding film such as Cr formed on the substrate, a mask blank used to produce a phase shift mask and comprising a substrate and a phase shift film formed on the substrate, and a mask blank used to produce a reflective mask and comprising a substrate, a reflective film such as a Mo/Si multilayer reflective film for reflecting exposure light, and an absorber film such as a Ta-based absorber film for absorbing the exposure light.

According to this invention, the housing member for housing the mask blank having a chemically amplified resist film is subjected to the treatment for removing from the housing member the chemical substance inhibiting the chemically amplifying effect of the chemically amplified resist. Thus, it is possible to preliminarily release the chemical substance contained in the housing member and possibly released with lapse of time. Therefore, if the mask blank is housed and packaged by the use of the mask blank housing member subjected to the treatment according to this invention, the outgas of the chemical substance is not released with lapse of time. Thus, it is possible to prevent the mask blank having a chemically amplified resist film from being contaminated by the chemical substance. Therefore, a stable resist performance is assured even after storage of the mask blank. As a result, upon manufacture of a mask, a stable resist pattern is formed and a high-quality transfer mask is obtained with a desired mask pattern.

Further, by the use of the treatment of heating the housing member as the treatment for removing the chemical substance inhibiting the chemically amplifying effect of the chemically amplified resist, the effect of this invention can be achieved in a simple manner.

Now, the fourth embodiment will be described in conjunction with specific examples.

Example 4-1

A halftone film was formed on a quartz substrate (6 inch×6 inch) by sputtering. On the halftone film, a resist film was formed by spin coating to produce a mask blank with a resist film. As the halftone film, a MoSi metal film was used. As the resist film, a chemically amplified resist film of a positive type was used. The resist film was formed in a clean room cleaned by a combination of an activated carbon filter containing potassium carbonate, an activated carbon filter containing phosphoric acid, and an ULPA filter.

100 mask blanks were produced in the above-mentioned manner and housed in 10 containers having the structure illustrated in FIGS. 1, 2, 4 and 10. As a material of each of the cap, the container body, and the inner case of the container, PMMA resin was used. By the use of the PMMA resin, the container was formed into the structure illustrated in FIGS. 1, 2, 4, and 10. Thereafter, the container was cleaned with RO/DI water at a temperature of 40° C. After cleaning, the container was heat treated in a clean oven. The heat treatment was carried out at 50° C. for 30 minutes. Each of the cleaning step and the heat treating step was carried out in a clean room cleaned by the use of a combination of an activated carbon filter containing potassium carbonate, an activated carbon filter containing phosphoric acid, and an ULPA filter.

The operation of housing the mask blanks was also carried out in the clean room cleaned by the above-mentioned activated carbon filters and the ULPA filter.

The container was packaged in a package bag and transported by air cargo. The container after transported was held for about one month in a packaged state. Thereafter, the container was opened in a clean room similar to that mentioned above to take out the mask blanks. Each mask blank was subjected to electron beam writing, development, and etching in a predetermined manner to produce a phase-shift transfer mask. The quality of each phase-shift transfer mask thus produced was inspected in detail by the use of a scanning electron microscope. As a result, no serious defect was found in any one of the 100 phase-shift masks. Upon opening the container, acidic ions and basic ions on the inner surface of the container were analyzed by ion chromatography. The result is shown Table 1.

Example 4-2

Mask blanks were housed, transported, and stored by the use of the container produced in the manner similar to Example 1 except that the container was cleaned with RO/DI water kept at 70° C.

In the manner similar to Example 1, a phase shift mask was produced by the use of the mask blank after storage. The quality of each phase-shift mask thus produced was inspected in detail by the use of a scanning electron microscope. As a result, no serious defect was found in any one of the 100 phase-shift masks. The result of analyzing acidic ions and basic ions on the inner surface of the container upon opening the container is shown in Table 1.

Example 4-3

Mask blanks were housed, transported, and stored by the use of the container produced in the manner similar to Example 1 except that the container was cleaned with RO water kept at 40° C.

In the manner similar to Example 1, a phase shift mask was produced by the use of the mask blank after storage. The quality of each phase-shift mask thus produced was inspected in detail by the use of a scanning electron microscope. As a result, no serious defect was found in any one of the 100 phase-shift masks The result of analyzing acidic ions and basic ions on the inner surface of the container upon opening the container is shown in Table 1.

Comparative Example

Mask blanks were housed, transported, and stored by the use of the container produced in the manner similar to Example 1 except that the container after cleaning was not heat treated but was left at room temperature.

In the manner similar to Example 1, a phase shift mask was produced by the use of the mask blank after storage. The quality of each phase-shift mask thus produced was inspected in detail by the use of a scanning electron microscope. As a result, disturbance in line width of a pattern was observed in each of 100 masks. The result of analyzing acidic ions and basic ions on the inner surface of the container upon opening the container is shown in Table 1.

TABLE 1

| | Container | | | ($ng/cm^2$) | | | |
| | | | | acidic ions | | | basic ions |
| | resin material | Cleaning | heat treatment | $Cl^-$ | $SO_4^{2-}$ | $HPO_3^{2-}$ | $NH_4^+$ |
| --- | --- | --- | --- | --- | --- | --- | --- |
| Example 4-1 | PMMA | RO/DI Water (40° C.) | 50° C. 30 minutes | not detected | not detected | not detected | not detected |
| Example 4-2 | PMMA | RO/DI Water (70° C.) | 50° C. 30 minutes | not detected | not detected | not detected | not detected |
| Example 4-3 | PMMA | RO Water (40° C.) | 50° C. 30 minutes | 0.8 | 0.9 | not detected | 0.9 |
| Comparative Example | PMMA | RO/DI Water (40° C.) | None (left at room temperature) | 4.7 | 4.5 | 36 | 4.5 |

The reason is supposed as follows. As seen from the result in Table 1, even if the PMMA resin which releases a relatively small amount of outgas was used, chemical substances, such as an acidic substance and a basic substance, were released from the container into the interior of the container while the mask blanks were housed and stored. The chemically amplified resist film of the mask blank was chemically contaminated by the chemical substances released from the container.

In Examples 4-1 to 4-3 of this embodiment, the container produced by the use of the heat treatment according to this invention. Therefore, while the mask blank was housed and stored, no substantial amount of chemical substance contaminating the chemically amplified resist film is released from the container. On the contrary, in Comparative Example without the heat treatment of this invention, the chemical substance contaminating the chemically amplified resist film is released from the container while the mask blank was housed and stored.

While this invention has thus far been described in conjunction with the preferred embodiments thereof, it will be readily possible for those skilled in the art to put this invention into practice in various other manners without departing from the scope of this invention.

What is claimed is:

1. A container which is for housing a mask blank having a chemically amplified resist film in its interior and which comprises a container body having an upper opening and a cap member to be put on the container body, wherein the container has an elastic member formed on at least one of an opening edge of the container body and a lower edge of the cap member to extend throughout entire circumference so that the interior of the container is hermetically sealed under an atmosphere in which at least an acid substance is removed by a heating treatment or a cleaning treament to an extent that the chemically amplified resist film is not contaminated when the cap member is put on the container body.

2. A container which is for housing a mask blank having a chemically amplified resist film in its interior and which comprises a container body having an upper opening and a cap member to be put on the container body, wherein the container has an elastic member formed on at least one of an opening edge of the container body and a lower edge of the cap member to extend throughout entire circumference so that the elastic member is interposed between the opening edge of the container body and the lower edge of the cap member at a joint portion therebetween when the cap member is put on the container body, whereby the interior of the container is hermetically sealed under an atmosphere in which at least an acid substance is removed by a heating treatment or a cleaning treament to an extent that the chemically amplified resist film is not contaminated.

3. A container according to claim 1 or 2, wherein the joint portion is fixed and secured by a sliding locking member for clamping the joint portion between the container body and the cap member.

4. A method of housing a mask blank, wherein the mask blank having a chemically amplified resist film is housed in a container according to claim 1 or 2.

5. A method according to claim 4, wherein the acid substance in the atmosphere contains chlorine ions, sulfate ions or nitrate ions, wherein a content of the chlorine ions is 0.05 μg or less per 1 $m^3$ of the atmosphere, a content of the sulfate ions is 0.1 μg or less per 1 $m^3$ of the atmosphere, and a content of the nitrate ions is 0.7 μg or less per 1 $m^3$ of the atmosphere.

6. A mask blank package, which is obtained by housing a mask blank by a method according to claim 4.

7. A mask blank package according to claim 6, wherein the acid substance in the atmosphere contains chlorine ions, sulfate ions or nitrate ions, wherein a content of the chlorine ions is 0.05 μg or less per 1 $m^3$ of the atmosphere, a content of the sulfate ions is 0.1 μg or less per 1 $m^3$ of the atmosphere, and a content of the nitrate ions is 0.7 μg or less per 1 $m^3$ of the atmosphere.

8. A container which is for housing a mask blank having a chemically amplified resist film in its interior and which at least comprises a container body having an upper opening and a cap member to be put on the container body, comprises a mechanism for inhibiting entry of foreign matters in ambient air into the container, wherein the mechanism has a vent hole formed on the container to allow communication between the ambient air and internal air, and a filtering member formed in the vent hole to remove the foreign matters in the ambient air, wherein the foreign matters in the ambient air is a chemical substance inhibiting a desired chemically amplifying effect in the chemically amplified resist, and wherein the cap member is put on the container body under an atmosphere in which at least an acid substance is removed by a heating treatment or a cleaning treatment to an extent that the chemically amplified resist film is not contaminated.

9. A mask blank package, which is obtained by housing the mask blank in the container according to claim 8.

10. A method of transporting a mask blank package according to claim 9, wherein the mask blank package is transported by the use of traffic means.

11. A container according to claims 1, 2 or 8 wherein the acid substance in the atmosphere contains chlorine ions, sulfate ions or nitrate ions, wherein a content of the chlorine ions is 0.05 μg or less per 1 $m^3$ of the atmosphere, a content of the sulfate ions is 0.1 μg or less per 1 $m^3$ of the atmosphere, and a content of the nitrate ions is 0.7 μor less per 1 $m^3$ of the atmosphere.

12. A container according to claim 8, wherein the chemical substance is an acid substance.

13. A container according to claim 8 or 12, wherein the filtering member is a chemical filter for adsorbing the chemical substance.

14. A container according to claim 8, wherein the filtering member serves to remove the foreign matters only in the ambient air.

15. A method of housing a mask blank having a chemically amplified resist film in a container, wherein the mask blank is housed in the container together with an atmosphere from which at least an acidic substance is removed.

16. A method according to claim 15, comprising the step of:

supplying the container with the atmosphere to replace an interior of the container, or purging the container by the atmosphere.

17. A method of housing a mask blank having a chemically amplified resist film in a container, wherein the mask blank is housed in the container under an atmosphere from which at least an acidic substance is removed.

18. A method according to claim 15 or 17, wherein the container has means for absorbing or adsorbing the acidic substance.

19. A method according to claims 10, 15, 14 or 17 wherein the acid substance in the atmosphere contains chlorine ions, sulfate ions or nitrate ions,
- wherein a content of the chlorine ions is 0.05 μg or less per 1 m$^3$ of the atmosphere,
- a content of the sulfate ions is 0.1 μg or less per 1 m$^3$ of the atmosphere, and
- a content of the nitrate ions is 0.7 μg or less per 1 m$^3$ of the atmosphere.

20. A method according to claim 17, comprising the step of: using a chemical filter upon housing the mask blank in the container.

21. A mask blank package, wherein a mask blank having a chemically amplified resist film is housed in a container having an atmosphere which does not contain at least an acidic substance.

22. A mask blank package according to claim 9 or 21 wherein the acid substance in the atmosphere contains chlorine ions, sulfate ions or nitrate ions,
- wherein a content of the chlorine ions is 0.05 μg or less per 1 m$^3$ of the atmosphere,
- a content of the sulfate ions is 0.1 μg or less per 1 m$^3$ of the atmosphere, and
- a content of the nitrate ions is 0.7 μg or less per 1 m$^3$ of the atmosphere.

* * * * *